(12) United States Patent
Tice

(10) Patent No.: US 10,473,396 B2
(45) Date of Patent: Nov. 12, 2019

(54) WAFER DRYER APPARATUS AND METHOD

(71) Applicant: MEI, LLC, Albany, OR (US)

(72) Inventor: Scott Tice, Albany, OR (US)

(73) Assignee: MEI Wet Processing Systems & Services LLC, Albany, OR (US)

( * ) Notice: Subject to any disclaimer, the term of this patent is extended or adjusted under 35 U.S.C. 154(b) by 64 days.

(21) Appl. No.: 15/782,233

(22) Filed: Oct. 12, 2017

(65) Prior Publication Data

US 2018/0031317 A1 Feb. 1, 2018

Related U.S. Application Data

(63) Continuation of application No. 15/059,135, filed on Mar. 2, 2016, now Pat. No. 9,829,249.

(60) Provisional application No. 62/131,172, filed on Mar. 10, 2015.

(51) Int. Cl.
| | |
|---|---|
| *F26B 21/14* | (2006.01) |
| *H01L 21/67* | (2006.01) |
| *F26B 3/04* | (2006.01) |
| *F26B 5/00* | (2006.01) |
| *F26B 15/08* | (2006.01) |
| *H01L 21/677* | (2006.01) |
| *H01L 21/02* | (2006.01) |

(52) U.S. Cl.
CPC ............... *F26B 21/14* (2013.01); *F26B 3/04* (2013.01); *F26B 5/00* (2013.01); *F26B 15/08* (2013.01); *H01L 21/67017* (2013.01); *H01L 21/67023* (2013.01); *H01L 21/67028* (2013.01); *H01L 21/67034* (2013.01); *H01L 21/67781* (2013.01); *H01L 21/02057* (2013.01)

(58) Field of Classification Search
CPC .... F26B 21/14; F26B 3/04; F26B 5/00; F26B 15/08; H01L 21/67017; H01L 21/67023; H01L 21/67028; H01L 61/67034; H01L 21/67781; H01L 21/02057
USPC .......................................................... 34/500
See application file for complete search history.

(56) References Cited

U.S. PATENT DOCUMENTS

| | | | | |
|---|---|---|---|---|
| 5,535,525 A | * | 7/1996 | Gardner | F26B 21/145 134/105 |
| 5,608,974 A | * | 3/1997 | Tanaka | F26B 5/04 118/58 |
| 5,671,544 A | * | 9/1997 | Yokomizo | F26B 21/145 34/169 |

(Continued)

OTHER PUBLICATIONS

International Search Report dated Jun. 13, 2016, issued by the Israel Patent Office in corresponding Patent Cooperation Treaty Application No. PCT/US2016/020764, filed Mar. 3, 2016.

(Continued)

*Primary Examiner* — Stephen M Gravini
(74) *Attorney, Agent, or Firm* — Klarquist Sparkman, LLP

(57) ABSTRACT

Wafers on a first wafer carrier in a tank are lifted from the first wafer carrier and a bath in the tank so as to accomplish Marangoni drying of the wafers. The lifted dry wafers are positioned on a second wafer carrier in a chamber and shifted to an offset position. A barrier, which can be a wall of the chamber with or without a sweeping flow of gas, impedes the passage of deposits to the wafers arising during drying of the first wafer carrier. Static electricity can be discharged from wafer supports in the offset position.

23 Claims, 14 Drawing Sheets

(56) References Cited

U.S. PATENT DOCUMENTS

| | | | |
|---|---|---|---|
| 5,902,402 A | 5/1999 | Durst et al. | |
| 5,950,328 A * | 9/1999 | Ichiko | H01L 21/67034 34/364 |
| 5,956,859 A * | 9/1999 | Matsumoto | H01L 21/67034 34/208 |
| 6,032,382 A * | 3/2000 | Matsumoto | H01L 21/02052 257/E21.228 |
| 6,108,932 A * | 8/2000 | Chai | H01L 21/67034 34/245 |
| 6,119,367 A * | 9/2000 | Kamikawa | H01L 21/67034 34/164 |
| 6,128,830 A | 10/2000 | Bettcher et al. | |
| 6,134,807 A * | 10/2000 | Komino | H01L 21/67034 34/418 |
| 6,158,141 A | 12/2000 | Asada et al. | |
| 6,212,789 B1 | 4/2001 | Kato et al. | |
| 6,219,936 B1 * | 4/2001 | Kedo | H01L 21/67028 34/202 |
| 6,575,178 B1 | 6/2003 | Kamikawa | |
| 6,692,165 B2 | 2/2004 | Tanaka et al. | |
| 6,883,248 B2 | 4/2005 | Ko et al. | |
| 6,928,748 B2 * | 8/2005 | Chen | H01L 21/02063 257/E21.228 |
| 7,100,306 B2 | 9/2006 | Jun et al. | |
| 7,131,217 B2 * | 11/2006 | Kim | H01L 21/67034 34/630 |
| 7,228,645 B2 * | 6/2007 | Pham | H01L 21/67034 118/608 |
| 7,877,895 B2 | 2/2011 | Otsuka et al. | |
| 7,980,000 B2 | 7/2011 | Lewis et al. | |
| 8,322,045 B2 | 12/2012 | Stein et al. | |
| 8,393,091 B2 | 3/2013 | Kawamoto | |
| 9,070,631 B2 | 6/2015 | Tice | |
| 9,279,616 B2 | 3/2016 | Gibbel | |
| 9,562,291 B2 | 2/2017 | Tice et al. | |
| 9,829,249 B2 * | 11/2017 | Tice | F26B 21/14 |
| 2001/0045223 A1 | 11/2001 | Cho et al. | |
| 2003/0051995 A1 | 3/2003 | Nobata et al. | |
| 2006/0237033 A1 | 10/2006 | Yi et al. | |
| 2010/0218791 A1 | 9/2010 | Tanaka et al. | |
| 2012/0260517 A1 | 10/2012 | Lenz et al. | |
| 2016/0265846 A1 | 9/2016 | Tice | |
| 2018/0031317 A1 * | 2/2018 | Tice | F26B 21/14 |

OTHER PUBLICATIONS

Written Opinion dated Jun. 13, 2016, issued by the Israel Patent Office in corresponding Patent Cooperation Treaty Application No. PCT/US2016/020764, filed Mar. 3, 2016.

Supplementary European Search Report dated Oct. 5, 2018, issued by the European Patent Office in corresponding European Patent Application No. EP 16762191.1, filed Mar. 1, 2016.

* cited by examiner

WAFER DRYER APPARATUS AND METHOD

CROSS REFERENCE TO RELATED APPLICATION

This application is a Continuation of U.S. patent application Ser. No. 15/059,135, entitled WAFER DRYER APPARATUS AND METHOD, filed Mar. 2, 2016. This application also claims the benefit of United States Provisional Application Ser. No. 62/131,172, entitled WAFER DRYER APPARATUS AND METHOD, filed on Mar. 10, 2015. Both applications are incorporated by reference herein.

FIELD

This disclosure relates to semiconductor wafer dryers and to methods of drying semiconductor wafers.

BACKGROUND

Marangoni dryers have been used in the past to dry semiconductor wafers that are being processed, such as by liquid baths.

Marangoni drying is based on surface tension gradient forces and is an ultra-clean drying process. In this technique, a volatile organic compound, such as isopropyl alcohol (IPA), with lower surface tension than water, is introduced in the vicinity of a substrate semiconductor wafer in the form of a vapor as the substrate wafer is slowly withdrawn from the water. This assumes a water bath. As the small quantity of alcohol vapor comes into contact with the continuously refreshed water meniscus, it is absorbed into the water and creates a surface tension gradient. The gradient causes the meniscus to partially contract and assume an apparent finite flow angle. This causes a thin water film to flow off the substrate and leaves it dry. This flow also will assist in removing non-volatile contaminants and entrained particles.

In a known Marangoni dryer, semiconductor wafers are submerged in deionized water (DI water). An airtight cover or lid is placed over the bath that contains the submerged wafers, creating a sealed process chamber. Air is purged from the chamber with nitrogen gas (N2) and an IPA (isopropyl alcohol) bubbler produces IPA vapor that is introduced with N2 into the chamber. A thin layer of IPA forms on the DI water surface. Wafers are slowly passed through this IPA layer and onto a wafer carrier positioned in the IPA/N2 vapor environment.

In another known approach, the wafers are submerged in a bath of a dilute concentration of hydrofluoric acid. Following treatment by the acid bath, deionized water is introduced into the bath to flush out the hydrofluoric acid through an overflow. Marangoni drying, as described above, is then performed.

In the absence of Marangoni drying, the surface tension of DI water on semiconductor wafer features of small size (e.g. 30 nanometer features) can cause feature damage by clinging, pulling, bending or breaking structures due to this surface tension.

Although Marangoni drying of semiconductor wafers offers advantages, semiconductor wafers processed with Marangoni dryers known to the inventor have resulted in the depositing of materials on processed dried wafers, such as liquid that leaves behind water marks on the wafers. These water marks may have gone unnoticed at 120 nanometer feature sizes and above. However, they are visible using, for example Surfscan lasers, when looking at wafers having 75 nanometer or smaller features. These deposits can result in problems for wafers with small features.

Therefore, a more effective dryer and method of drying semiconductor wafers using Marangoni drying techniques is needed.

SUMMARY

In accordance with an aspect of an embodiment of this disclosure, one or more semiconductor wafers in a liquid bath are lifted from a first position on a first wafer carrier in the bath to a second position above the bath. A mixture of nitrogen (N2) and isopropyl alcohol (IPA) flows onto the one or more wafers as the one or more wafers are lifted from the bath and from the first carrier to the second position. The exposure of the wafers to the IPA is at a rate such that the surfaces of the one or more wafers are dried at least in part by the surface tension gradient between the IPA and the liquid in the bath; that is by Marangoni drying. The dried wafers are moved from the second position to a third position spaced from a position above the bath and to no longer overlay the first wafer carrier. The first wafer carrier is dried, such as initially by Marangoni drying by draining the bath to expose the first wafer carrier to IPA followed by accelerated drying, such as using heated N2 gas. The dried wafers are at the third position away from the first wafer carrier before the accelerated drying step using the N2 gas. The one or more wafers in the third position are shielded from deposits generated from the accelerated drying of the first wafer carrier. The shield can comprise a barrier such as a wall of the chamber and also gas sweeping the wafers in the third position. The wafers can be returned the first wafer carrier following drying of the first wafer carrier to complete the drying cycle. An apparatus and a system for accomplishing this drying cycle is also a part of this disclosure.

In accordance with an embodiment, a method of drying semiconductor wafers can comprise: lifting one or more semiconductor wafers in a liquid bath from a first position on a first wafer carrier in the bath to a second position above the bath, which act of lifting can include positioning the one or more wafers on a second wafer carrier; Marangoni drying of the one or more wafers by flowing a mixture of nitrogen (N2) and isopropyl alcohol (IPA) onto the one or more wafers as the one or more wafers are lifted from the bath and from the first carrier to the second position such that the surfaces of the one or more wafers are dried at least in part by the surface tension gradient between the IPA and the liquid in the bath; moving the wafers from the second position to an offset position, which can be over a recess, the act of moving the wafers to the second position can comprise moving the second wafer carrier with the one or more wafers thereon from the second position to a third position spaced from a position above the first wafer carrier; and drying the first wafer carrier such comprising draining the liquid from the bath to expose the first wafer carrier, flowing a mixture of N2 and IPA onto the first wafer carrier as the first wafer carrier emerges from the bath and as the bath is drained such that the first wafer carrier is dried at least in part by the surface tension between the IPA and surfaces of the first wafer carrier, and directing heated N2 onto the first wafer carrier to accelerate drying of the first wafer carrier; and returning the one or more wafers to the first wafer carrier following drying of the first wafer carrier.

Additional aspects of this disclosure include the above embodiments with any one or more of the following aspects, in all possible combinations and sub-combinations with one another:

A method wherein N2 is directed toward the one or more wafers on the second wafer carrier during at least a portion of the time that heated N2 is directed onto the first wafer carrier.

A method wherein the N2 is directed toward the one or more wafers on the second wafer carrier as the second wafer carrier is moved to the third position and during at least a portion of the time that heated N2 is directed onto the first wafer carrier.

A method wherein the N2 is directed toward the one or more wafers on the second wafer carrier during the entire time that the first wafer carrier is being dried.

A method wherein the N2 directed toward the one or more wafers on the second wafer carrier is heated N2.

A method wherein the act of returning the one or more wafers to the first wafer carrier comprises moving the second wafer carrier with the one or more wafers thereon from the third position to the second position and lowering the one or more wafers from the second position to the first position on the first carrier.

A method wherein in the third position the second wafer carrier is entirely offset from a position above the liquid bath.

A method wherein the act of lifting the one or more wafers to the second position comprises lifting the one or more wafers to the second position in a chamber above the bath and positioning the one or more wafers on the second wafer carrier in the chamber; and wherein the act of moving the second wafer carrier with the one or more wafers thereon from the second position to a third position comprises moving the second chamber to move the second wafer carrier with the one or more wafers thereon from the second position to the third position.

A method comprising enclosing the second wafer carrier in the chamber at least when the second carrier is in the third position to thereby screen the one or more wafers on the second carrier from mist and droplets generated during drying of the first carrier.

A method comprising providing a barrier between the first wafer carrier and the one or more wafers on the second wafer carrier in the third position to impede mist and droplets generated during drying of the first wafer carrier from reaching the one or more wafers on the second carrier in the third position.

A method wherein the act of providing a barrier comprises flowing N2 gas over the at least one or more wafers on the second carrier in the third position in a direction that sweeps mist and droplets generated during drying of the first wafer carrier away from the one or more wafers.

A method wherein the act of providing a barrier comprises positioning a shield between the at least one or more wafers on the second carrier in the third position and the first wafer carrier.

A method wherein the shield comprises a wall of a chamber within which the one or more wafers and the second carrier are positioned.

A method according comprising discharging static electricity from the second carrier in the third position, such as by operating one or more ionizers to discharge static electricity from the second carrier in the third position.

The disclosure also encompasses an apparatus and system that carries out the drying methods.

In accordance with an embodiment, such a system or apparatus for drying semiconductor wafers can comprise: a wafer receiving tank having a top portion with a wafer carrier receiving opening sized for receiving a first wafer carrier with one or more semiconductor wafers thereon, and a bottom portion, the tank having a liquid inlet communicating with the bottom portion for coupling to a source of cleaning liquid, the tank having at least one overflow outlet at a top portion of the tank such that liquid from the inlet flows upwardly to the at least one overflow outlet, the tank having a drain outlet communicating with a bottom portion of the tank; a valve operably coupled to the drain outlet to control the rate of draining of liquid from the tank through the drain outlet to thereby control the rate that the level of liquid drops in the tank; a wafer carrier lifter positioned in the tank to receive the first wafer carrier with one or more semiconductor wafers thereon through the wafer carrier receiving opening, the wafer carrier lifter being operable to lift and lower the first wafer carrier and the one or more semiconductor wafers thereon between a first lowered wafer carrier position and a second elevated wafer carrier position, wherein when in the first lowered position the first wafer carrier and the one or more semiconductor wafers thereon are submerged in liquid in the tank, the wafer carrier lifter also being operable to lift the one or more semiconductor wafers at a controlled wafer lifting rate from the first wafer carrier to a wafer transfer position above the wafer carrier receiving opening; a wafer drying chamber coupled to the tank and movable from a first drying chamber position overlaying and covering the wafer carrier receiving opening to a second offset position offset from the wafer carrier receiving opening, a second wafer carrier in the wafer dryer operable to receive and carry the one or more wafers in the wafer transfer position, the wafer drying chamber comprising a first gas inlet for coupling to a source of blended isopropyl alcohol and nitrogen (IPA/N2) with the wafer drying chamber in the first drying chamber position to provide IPA/N2 to the surfaces of the wafers as the wafers are lifted out of the liquid by the wafer carrier lifter to the wafer transfer position, there being sufficient IPA in the IPA/N2 blend to at least partially dry the surfaces of the wafers by surface tension gradient drying as the wafers are lifted out of the liquid; a wafer drying chamber mover for moving the wafer drying chamber between the first drying chamber position and the second offset position; the valve being operable to drain the liquid from the tank through the drain at a rate such that the IPA/N2 at least partially dries the surfaces of the first carrier and wafer lifter as the tank is drained to expose the first carrier and wafer lifter; the wafer drying chamber mover being operable to move the wafer drying chamber and the second wafer carrier with the received one or more wafers from the wafer transfer position with the movement of the wafer drying chamber to the offset position; the wafer drying chamber having an inlet for coupling to a source of nitrogen (N2) to deliver N2 to the wafers in the offset position; and gas delivery wands or bars being positioned in the tank for coupling to a source of N2 to deliver N2 to the tank to continue drying the first wafer carrier and wafer lifter following exposure of the first carrier and wafer lifter.

In accordance with an embodiment, an apparatus for drying semiconductor wafers can also comprise: a wafer receiving tank comprising a tank body which defines an interior tank chamber comprising upper and lower tank chamber portions, a top portion with a wafer carrier receiving opening communicating with the tank chamber and sized for receiving a first wafer carrier with one or more semiconductor wafers thereon, and a bottom portion, the tank further comprising a liquid inlet communicating with the lower tank chamber portion and for coupling to a source of cleaning liquid, the tank chamber having at least one overflow outlet at the upper tank chamber portion such that liquid from the liquid inlet flows upwardly to the at least one overflow outlet, the tank having a drain outlet communicating with the lower tank chamber portion; a wafer carrier lifter positioned in the tank chamber and positioned to receive a first wafer carrier with one or more semiconductor wafers thereon through the wafer carrier receiving opening, the wafer carrier lifter being operable to lift and lower the first wafer carrier and the one or more semiconductor wafers thereon from a first lower wafer carrier position to a second elevated wafer carrier transfer position above the wafer carrier receiving opening, wherein when in the first lower wafer carrier position the first wafer carrier and the one or more semiconductor wafers thereon are submerged in liquid in the interior tank chamber, the wafer carrier lifter also being operable to lift the first wafer carrier with the one or more semiconductor wafers at a controlled wafer lifting rate from the first wafer carrier position to the second elevated wafer carrier transfer position; a wafer drying chamber coupled to the tank and movable from a first drying chamber position overlaying and covering the wafer carrier receiving opening to a second drying chamber position that is offset from the wafer carrier receiving opening, a second wafer carrier positioned in the wafer drying chamber operable to receive the one or more wafers on the first wafer carrier lifted to the second elevated wafer carrier transfer position, the wafer drying chamber comprising a first gas inlet for coupling to a source of blended isopropyl alcohol and nitrogen (IPA/N2) so as to provide IPA/N2 to the surfaces of the wafers as the wafers are lifted out of the liquid by the wafer carrier lifter toward the second elevated wafer transfer position, there being sufficient IPA in the IPA/N2 blend to at least partially dry the surfaces of the wafers by surface tension gradient drying as the wafers are lifted out of the liquid; a wafer drying chamber mover for moving the wafer drying chamber between the first and second drying chamber positions; the valve coupled to the tank chamber and operable to drain the liquid from the tank through the drain at a rate that the IPA/N2 at least partially dries the surfaces of the first carrier and wafer lifter as the tank is drained to expose the first carrier and wafer lifter; the wafer drying chamber mover being operable to move the wafer drying chamber and the second wafer carrier with the received one or more wafers from the first drying chamber position to the second drying chamber position and from the second drying chamber position to the first drying chamber position; and at least one gas applicator positioned in the tank chamber for coupling to a source of N2 to deliver N2 to the first wafer carrier to continue drying the first wafer carrier and wafer lifter following exposure of the first wafer carrier and wafer lifter with the wafer drying chamber in the second drying chamber position.

The apparatus can include one or more additional features in all combinations and sub-combinations with one another including: (a) a recess defining structure having a recess positioned beneath the one or more wafers on the second wafer carrier with the wafer drying chamber in the second position; (b) a static discharger positioned to discharge static electricity from the recess defining structure; (c) a wafer dryer support, the wafer drying chamber being slidably coupled to the wafer dryer support for sliding movement of the wafer drying chamber between the first and second positions by the wafer drying chamber mover; (d) a wafer dryer chamber having a gas outlet for coupling to a source of N2 to direct a flow of N2 gas across the one or more wafers on the second carrier at least while the wafer drying chamber is in the second position; and/or (e) a recess defining structure having a recess positioned beneath the one or more wafers on the second wafer carrier with the wafer drying chamber in the second position; a static discharger positioned to discharge static electricity from the recess defining structure; a wafer dryer support, the wafer drying chamber being slidably coupled to the wafer dryer support for sliding movement of the wafer drying chamber from the first to the second and the second to the first wafer drying chamber positions by the wafer drying chamber mover; and wherein the wafer dryer chamber has a gas outlet for coupling to a source of N2 to direct a flow of N2 gas across the one or more wafers on the second carrier at least while the wafer drying chamber is in the second position.

These and other method acts and features within the scope of this disclosure will become apparent from the following description and drawings.

DETAILED DESCRIPTION

In view of the many possible embodiments to which the principles of the disclosed invention may be applied, it should be recognized that the illustrated embodiments are only examples, and should not be taken as limiting the scope of the invention. All novel and non-obvious combinations and sub-combinations of elements described herein are within the scope of the invention.

Throughout this disclosure, when a reference is made to a first element being coupled to a second element, the term "coupled" is to be construed to mean both direct connection of the elements as well as indirect connection of the elements by way of one or more additional intervening elements. Also, the singular terms "a", "and", and "first", mean both the singular and the plural unless the term is qualified to expressly indicate that it only refers to a singular element, such as by using the phase "only one". Thus, for example, if two of a particular element are present, there is also "a" or "an" of such element that is present. In addition, the term "and/or" when used in this document is to be construed to include the conjunctive "and", the disjunctive "or", and both "and" and "or". Also, the terms "includes" and "has" have the same meaning as "comprises" and the terms "including" and "having" have the same meaning as "comprising".

Figure 1:
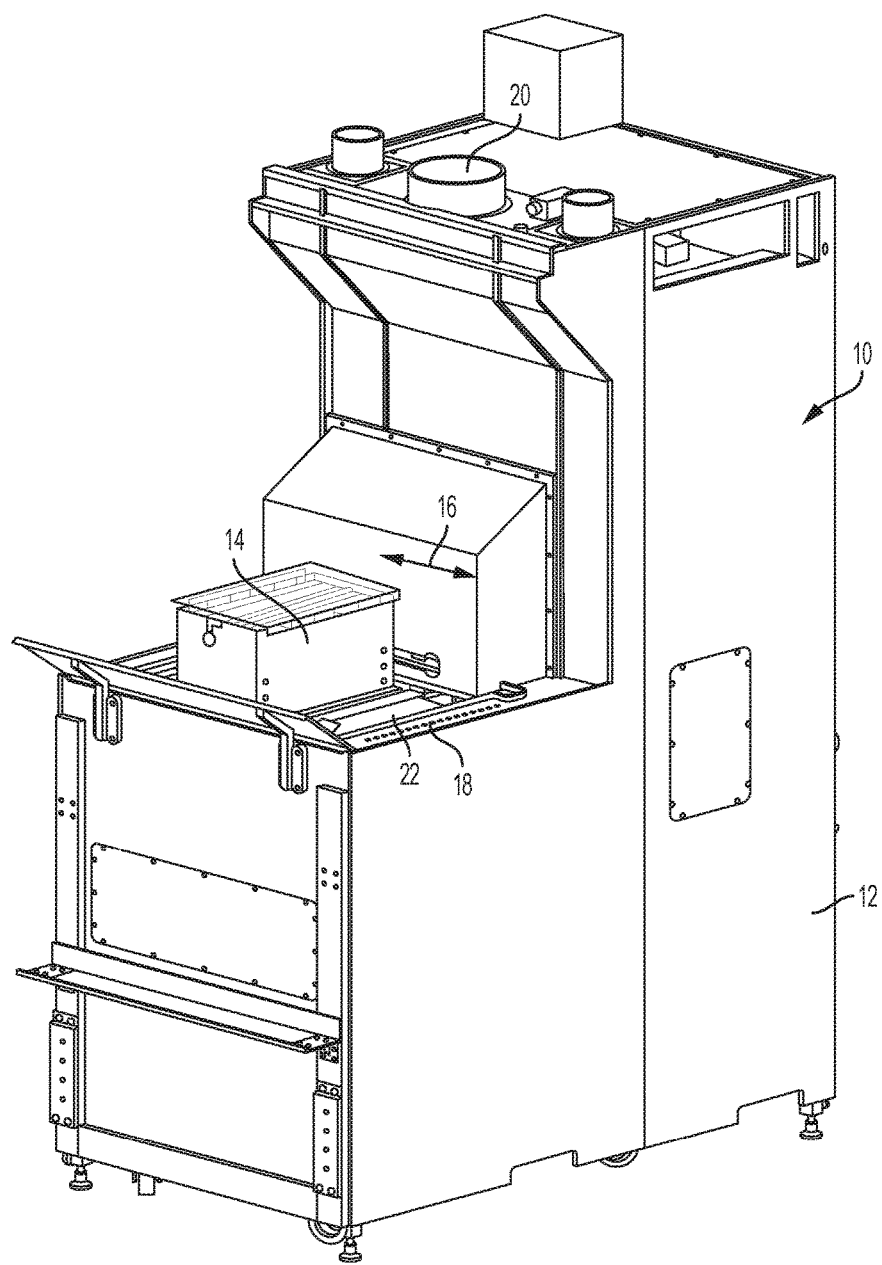
FIG. 1 is a perspective view of a semiconductor wafer dryer in accordance with an embodiment of this disclosure.

FIG. 1 is a perspective view of an embodiment of a dryer in accordance with this disclosure indicated generally at 10. The dryer comprises a housing 12 within which a liquid bath for receiving and cleaning the wafers is provided, the bath not being shown in FIG. 1. The housing comprises a lid or chamber 14 that is, in this embodiment movable, such as slidable, at least in the directions indicated by arrows 16 to and from an offset position in this embodiment. The offset drying chamber position is indicated at 18 wherein the lid or chamber 14 is desirably positioned away from and not overlaying an opening in the dryer that leads to a tank containing the liquid bath. As explained below, when an empty chamber 14 (no wafers positioned therein) is in the offset position, a first wafer carrier with one or more wafers thereon can be positioned above the tank opening and lowered into the tank opening with the first wafer carrier then placed or positioned on a wafer lifter or lifting structure within the dryer. The chamber can then be moved to a first drying chamber position overlaying the tank opening and overlaying wafers on the first wafer carrier in the tank.

The lid or chamber 14 is movable from a first position overlying the bath to a second or offset position spaced from the bath, such as entirely offset from the bath at one side thereof and over a deck area 22 of the dryer. In the second drying chamber position, the upwardly facing tank opening can be accessed to position a wafer carrier therein. Desirably chamber lid 14 is slidably coupled to the dryer body so that it is slidable between the first and second drying chamber positions. An actuator that is used to move the lid between its various positions. The actuator can comprise any suitable actuator such as a pneumatic piston with a needle speed control valve or an electric actuator, such as a stepper motor.

In an exemplary dryer, the lid can be positioned at the side or offset position when the dryer is idle. The lid can be, but need not be, sealed when over the bath or in the offset position. However, even though sealing is typically not required, the lid desirably is not provided with much open area so that N2 usage is conserved.

Thus, in this illustrated embodiment, the lid can be slid to the right in FIG. 1 to its offset drying chamber position and back in the opposite direction to a chamber drying position overlaying the tank opening shown in FIG. 1. Alternatively, the lid can be slid to yet another position (e.g., to the left in FIG. 1) over a recess area (an alternative offset position) as, for example, during the time a first wafer carrier in the tank is being dried following drying of wafers lifted from the first wafer carrier.

The illustrated dryer has an upwardly extending exhaust conduit 20 through which vapors from the dryer can be exhausted and scrubbed or otherwise processed.

The dryer is used to accomplish Marangoni drying of wafers. IPA vapor, created such as by bubbling with a nitrogen carrier, can be used to accomplish the Marangoni drying. The IPA/N2 used for Marangoni drying can be at ambient temperatures. The wafers, following cleaning within the bath, are lifted into the lid chamber 14 at a rate that accomplishes Marangoni drying of the wafers due to the IPA that is introduced into the dryer. The lid can form a vapor seal between the lid and deck 22 in the tank overlaying drying chamber portion.

In accordance with an embodiment, the wafers are lifted into the lid 14 and dried as they are lifted with the lid then being shifted to the offset or over recess position. The first wafer carrier (the carrier that was initially placed in the bath with the wafers) can then be separately dried such as by Marangoni drying with the bath being drained at a rate to accomplish this drying and the use of N2 gas (which can be heated) following draining of the tank. The chamber 14 and wafers positioned therein are desirably in the offset or over recess position as N2 gas is applied to dry the first wafer carrier. Drying of the first wafer carrier is not limited to this approach, but the combination of Marangoni drying and the use of a jet of heated N2 gas is a particularly effective way of rapidly drying the first wafer carrier.

Wafers are lifted from the bath by the lifter at a controlled rate to achieve Marangoni drying. Exemplary rates are from 0.75 mm per second to 2 mm per second, with 1 mm per second being a typical desirable rate. The rate can be varied with a slower rate being used if greater surface tension drying is required. This rate can also be achieved by a combination of lifting the wafers and draining the tank. The rate at which the wafer carrier is exposed by draining the bath is typically the same as the wafer lift rate, with 1 mm per second being a typical example.

It should be noted that the N2 can be provided at different flow rates at different steps during the drying process. For example, when N2/IPA is being provided to wafers as they are emerging from the bath, a typical flow rate can be about 20 SCFH when displacing IPA with only N2, an exemplary flow rate is 60 LPM. During the drying process when IPA vapor is not being displaced and N2 is not being used for drying, a typical N2 flow rate, such as in the lid, is maintained at a low level; but is desirably maintained while wafers are present in the dryer. IPA flow to the wafers is typically halted when the wafers reach or approach the offset, or over deck position, or an over recess position. By then the wafers are dry and they are moved to the offset position to protect them from the humidity that is created while drying the exposed carrier that has emerged from the bath.

Heated N2 is desirably used to displace the IPA and dry the carrier, such as following draining of the liquid from the bath.

Thus, in accordance with an embodiment, the chamber or lid 14 and one or more wafers positioned therein are moved from a first chamber drying position above the first wafer carrier to the right side (in FIGS. 1 and 2) to a position over the dryer deck during drying of the first wafer carrier. This is typically also where the lid sits while waiting for wafers to enter the tank. This solution works because the wafers held in wafer combs or another wafer carrier within the lid are moved away from the first wafer carrier during a hot N2 dry cycle used to dry the first wafer carrier. By moving the lid to the offset or idle position, the lid is over the deck; which keeps the wafers safely stored in a position where the humidity and aerosol mist generated during drying of the first wafer carrier cannot reach. Desirably after the first wafer carrier dry cycle is complete, the chamber 14 can be moved back over the carrier. The wafers in the chamber can be repositioned onto the dried first wafer carrier in the tank. This completes an exemplary drying cycle and the clean dry wafers and the first wafer carrier can be removed from the dryer. An enhancement to this approach is to flow N2 over the wafers in the on deck position while the carrier is being dried to further deflect undesired deposits and contaminants away from the wafers in the offset position.

This approach (even without the added N2 flow option) has proven to work fine for Hydrophillic wafers (oxide layer present), but can still have problems with drying Hydrophobic (HF Last) bare silicon wafers because the wafers are in close proximity to the dryer deck top when in the offset position. The deck typically is made of plastic and can hold a static charge. This charge causes particles to cling to the deck surface. Because the deck is in close proximity (0.75 inch or less) to the bottoms of the wafers (sitting in the lid wafer combs), and the Hydrophobic wafers tend to have a charge that attracts particles to the bottoms of the wafers. This can lead to particle failures of such wafers at the bottom in an arc with the worst contamination at the bottom center and the contamination decreasing along the edges to about 1.5-2 inches up from the bottom. Static electricity discharge can be used in the dryer offset position; such as using ion system bars to discharge or remove static electricity from the deck to address this problem. Another option is to move the wafers in the lid to an offset area that is not sitting over the deck. For example, the lid can be moved to an offset position over a recessed area which separates the wafers further from charged particles. Again, static discharges can also be used in the recess offset position. Ion system bars or other static electricity discharge devices can be used to neutralize the static charges on the surfaces and to provide superior performance on both hydrophilic and hydrophobic wafers.

Thus, in this example, to accomplish final drying of the carrier and lifting structure, nitrogen can be directed toward the first wafer carrier while the wafers are in the offset position. Hot nitrogen gas can be used for this drying. The chamber containing the wafers in the offset drying chamber position provides a barrier that prevents mist and droplets generated during drying of the first wafer carrier from being deposited onto the wafers.

In addition, nitrogen gas can be directed across the wafers in the lid or chamber 14 in the offset chamber drying position while the first wafer carrier is being dried to further sweep particles away from the wafers in the offset lid. The barrier desirably comprises either the walls of the chamber, the sweeping gas stream or most desirably both in combination. N2 is desirably vented from the lid 14 when the lid is in the over deck or offset position to the side of the bath. Holes or openings can be provided in the deck for N2 venting. This offset portion of the deck 22, indicated at 18 in FIG. 2, can be provided with slots or perforations to facilitate the flow of N2 wafer sweeping gas downwardly through the chamber, across the wafers and outwardly through the slots or perforations. In addition, slots with negative pressure from the fab exhaust can also be provided for use in venting nitrogen from the lid when in the offset or over deck position. The static pressure and flow of the vapor on the tank surfaces can be controlled.

In an exemplary dryer embodiment of this design, the N2 flow is typically not halted once the drying process starts. By maintaining the flow of N2 while the wafers are in the dryer, even following the drying of the wafers, a protective blanket of flowing gas is provided over the wafers.

In accordance with aspect of an embodiment, a semiconductor wafer dryer utilizes Marangoni drying (surface tension gradient drying) to dry wafers lifted off a first wafer carrier in the dryer during a wafer drying cycle. The lifted dry wafers can be held in a second wafer carrier, such as wafer combs in a chamber 14. The chamber 14 and dried wafers are desirably moved to an offset position before any hot N2 gas is used to dry the first wafer carrier.

The first wafer carrier can be initially dried by Marangoni drying; followed by accelerated final drying by applying N2 gas, such as heated N2 gas, directed toward the first wafer carrier. The first wafer carrier can be positioned near hot N2 bars. The first wafer carrier can then be dried by blowing hot N2 on the first wafer carrier, e.g., such as carrier rods, which hold the wafers during processing.

Movement of the lid to an offset position during accelerated drying of the first wafer carrier addresses the problem created as the dryer is being loaded. During loading, a carrier full of wet dripping wafers results in water dripping onto an N2 supply, such as N2 hot bars while the first wafer carrier passes over the dryer to a center position above the dryer tank. The N2 bars are typically mounted on the sides of the dryer tank opening (one on the left and one on the right side running from front to back). These drops of water land on the bars and become aerosol mist/humidity when the hot N2 bars are subsequently turned on to blow dry the first wafer carrier with heated N2 gas. The hot N2 bars are configured as air knives so the flow is fairly aggressive. Attempts to lower the flow rate and pressure were unsuccessful. This mist/humidity becomes air born in the tank and can redeposit on the wafers. As this mist/humidity dries it leaves behind water marks. Although this may have gone unnoticed at 120 nm feature sizes and above, the water marks can be seen by a Surfscan laser when looking at wafers at 75 nm.

Figure 2:
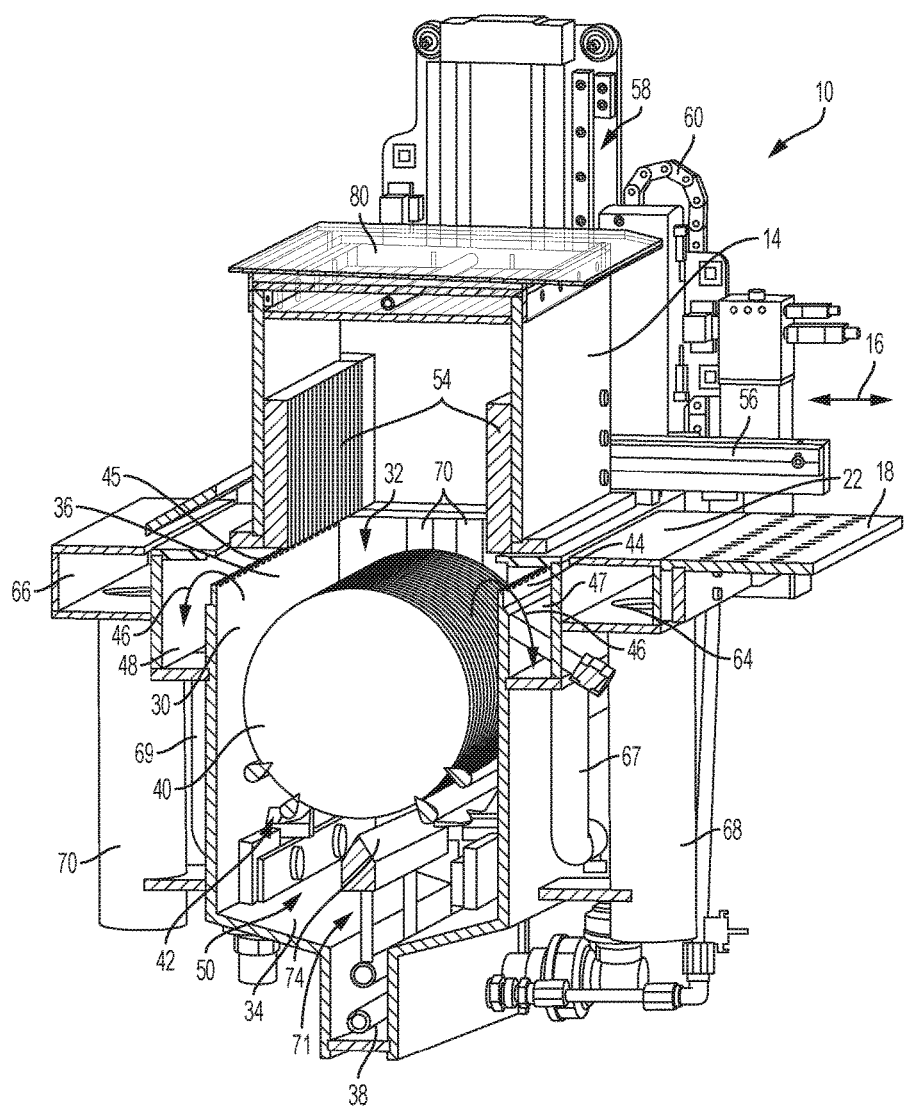
FIG. 2 is a partially broken away perspective view of the dryer of FIG. 1.

With reference to FIG. 2, the exemplary dryer 10 comprises a tank 30 inside the housing and accessible through the deck 22 by way of an upwardly facing access opening 32. In FIG. 2, the chamber 14 is shown positioned over the opening 32. The tank 30 has a lower tank portion 34 and an upper tank portion 36. During cleaning of wafers a cleaning fluid, such as deionized water (DI), is introduced into the lower tank portion 34, such as by way of a DI inlet 38. This water flows upwardly from the lower tank portion 34 to the upper tank portion 36, thereby washing one or more wafers 40 positioned on a first wafer carrier 42 in the tank. The liquid flows upwardly through the tank and over the top of respective weirs 44, 45 at opposite sides of the tank. The liquid flow path is shown by arrows 46 in FIG. 2. The liquid passes downwardly from the tank into drain channels 47, 48 and from the drain channels through conduits 67, 69 to a drain outlet of the dryer. The liquid can be recirculated as explained below to reduce the liquid requirements of the system.

One suitable liquid for a bath is deionized water (DI). Typically the DI is filtered before use. Other liquids can alternatively be used, as well as mixtures of liquid. For example, 100% IPA can be used along with mixtures or blends of IPA and DI. There are also chemical/solvents available that can be used that have lower surface tension than IPA. In manufacturing extremely sophisticated devices with, for example, 30 nanometer or smaller features, in the absence of Marangoni drying, the surface tension of water (DI) can cause feature damage by clinging, pulling, bending or breaking structures due to its surface tension. The bath can comprise an acid or other chemicals, such as hydrofluoric (HF) or hydrochloric (HCL) acids or other chemicals. These chemicals can be flushed from the bath by DI water prior to Marangoni drying.

An exemplary lifter is indicated generally at 50 in FIG. 2 and can comprise a first lifter 58 that, in the illustrated embodiment, initially lifts the first wafer carrier with wafers supported thereon upwardly toward the upper tank portion 36. The lifting occurs at a rate such that the wafers 40 emerging from the liquid bath are dried by the Marangoni effect due to the IPA rich environment above the bath. Thus, prior to lifting the carrier out of the bath, lifting of the first wafer carrier is desirably stopped. A wafer lifting portion of the lifter then lifts the wafers upwardly from the first wafer carrier to an upper or second wafer carrier within the chamber 14. The second wafer carrier can comprise wafer up position holders 54, which can be in the form of combs that grasp or engage the edges of the wafers. The lifter can perform both the first wafer carrier raising and the wafer lifting relative to the first wafer carrier. Alternatively, the lifter can include a first lifter used for lifting the first wafer carrier and wafers carried thereby and a second lifter for lifting the wafers from the first wafer carrier into a transfer zone in chamber 14 where the wafers are positioned to be transferred to and transported on the second wafer carrier with the movement of chamber 14. With the wafers on the second wafer carrier in the chamber 14, the chamber 14 and carried wafers can then be slid to the off deck position 18. In this position, desirably the chamber is entirely offset from the dryer opening 32.

Any suitable motor or actuator can be used to move the chamber 14 to and from the offset and/or recess positions and to lift the wafer carrier and wafers. For example, and as mentioned above, an electric stepper motor can drive a tank chain or belt to move the chamber 14 in the directions of arrow 16 back and forth from the tank overlaying position to offset or recess overlaying positions. A guide bar 56 can be used that slidably engages the chamber 14 to guide the sliding motion of the chamber. A stepper motor can also be used to lift the lifting structure to accomplish lifting of the carrier with the wafers thereon and also the wafers from the carrier during the process. The lifting motor can be generally coupled by a chain 60 which is coupled to the lifting structure 58. The chain can be driven by the motor for precisely lifting the structure at a controlled rate.

The illustrated wafer lifting structure can include vertical guide bars, two of which are indicated at 70 for guiding the upward movement of the lifter and the first wafer carrier 42 supported by the lifter as the first wafer carrier is lifted. In addition, a wafer lifter portion 71 for lifting the wafers off the first wafer carrier is also lifted as the first wafer carrier is lifted. Following lifting of the first wafer carrier to its end position, the wafer lifter 71, which comprises a wafer engaging projection 74, is extended upwardly relative to the first wafer carrier to lift the wafers off of the carrier into the second wafer carrier in the chamber 14. Following shifting of the chamber to the offset position, the wafer carrier and lifting structure is dried, such as by Marangoni drying accomplished by draining the tank at a rate that optimizes Marangoni drying. After the bath is drained in this example, gas is directed, such as heated N2 gas from an air knife (234, FIG. 18) toward the lifting structure and first wafer carrier to accelerate the drying of the first wafer carrier to accelerate the drying of the first wafer carrier. The chamber 14 is desirably moved to the offset position 18 at any time prior to directing gas toward the first wafer carrier.

The N2/IPA vapor is introduced into a dispenser chamber or manifold portion 80 of chamber 14 at the upper end of the chamber 14 for flowing downwardly through the chamber 14 and into the upper portion 36 of the tank 30 at appropriate times during the process. This same gas dispenser can be used to direct gas, such as N2 gas, into the chamber as and/or after the chamber 14 is moved to the offset and/or recess positions.

In FIG. 2, a plenum 64 is shown along one side of the upper portion of the tank 36 and a plenum 66 is shown at the opposite side of the upper tank chamber. The respective plenums are connected to conduits 68, 70 which direct gas (e.g., IPA vapor and N2 gas) flowing into the tank to an exhaust for recirculation.

By maintaining the flow of N2 while the wafers are in the dryer, even following the drying of the wafers, a protective blanket of flowing gas is provided over the wafers.

Figure 3:
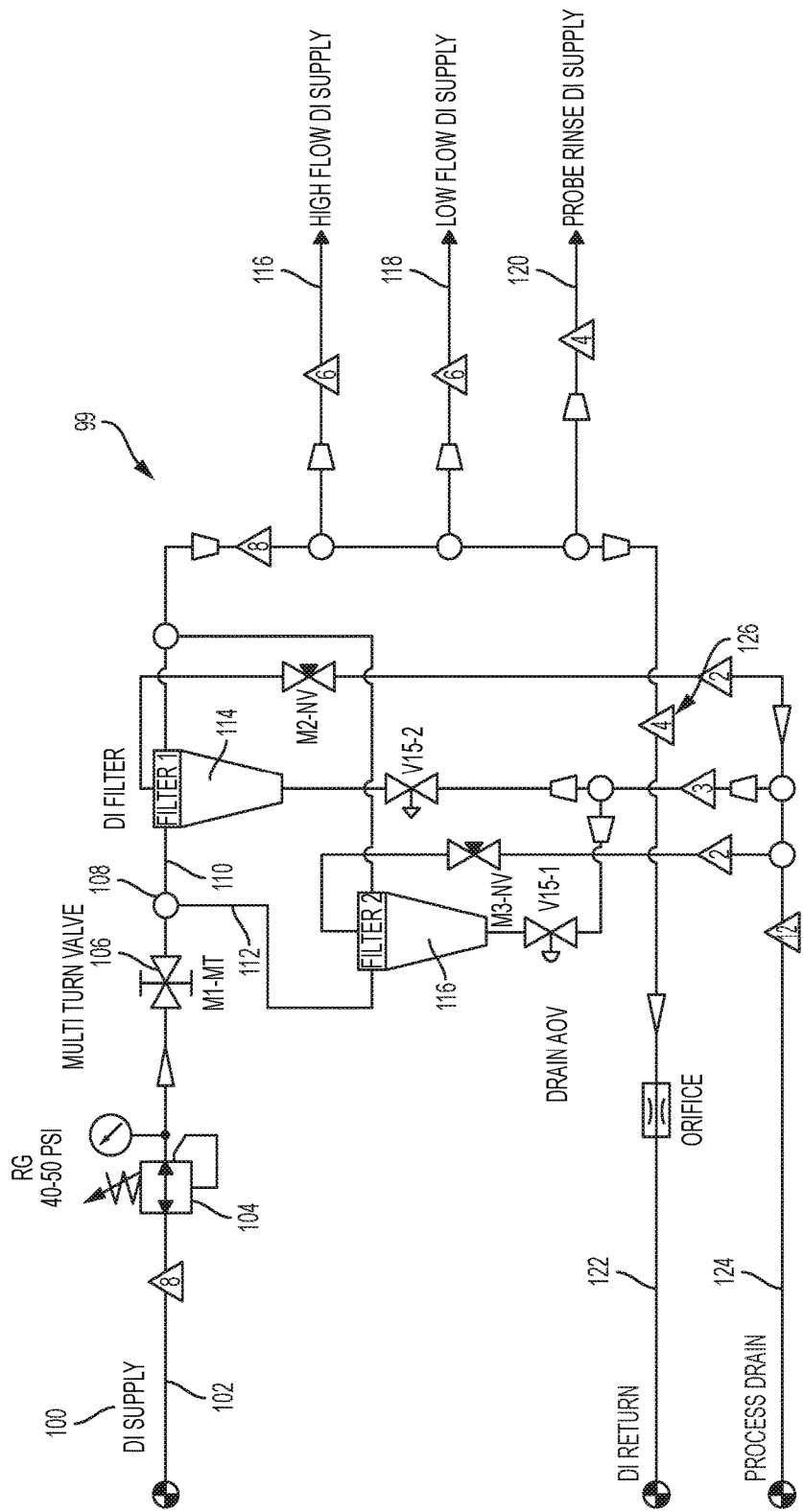
FIG. 3 is a schematic diagram of an exemplary approach for producing filtered deionized water (DI) for use in the dryer of FIGS. 1 and 2.

FIG. 3 illustrates an exemplary deionized (DI) water supply, filtration and recirculation system that can be used in the dryer 10.

With reference to FIG. 3, a DI supply source 100 is coupled to an inlet conduit 102 and through a pressure regulator 104 and control valve 106 to a branch 108. At branch 108, the DI in this example is split into two parallel branches 110, 112 that pass through respective parallel filters 114, 116 to filter the water to the desired level of filtration. Filtered (polished) DI water is delivered to the tank 36 through respective outlets 116, 118 and 120. Outlet 116 in this example is a high flow outlet for process applications where higher DI water requirements are needed. Outlet 118 is a low flow outlet for providing a lower flow DI water supply, such as when the dryer is in an idle state wherein the tank is awaiting wafers. The tank outlet 120 is a rinse outlet that provides DI for rinsing the dryer system.

A DI return line 122 is also shown in FIG. 3, together with a process drain line 124 coupled via series of pipes and valves, indicated generally by arrow 126, for draining the DI supply system. Thus, the system 99 provides an effective way of providing polished DI water to the dryer.

Figure 4:
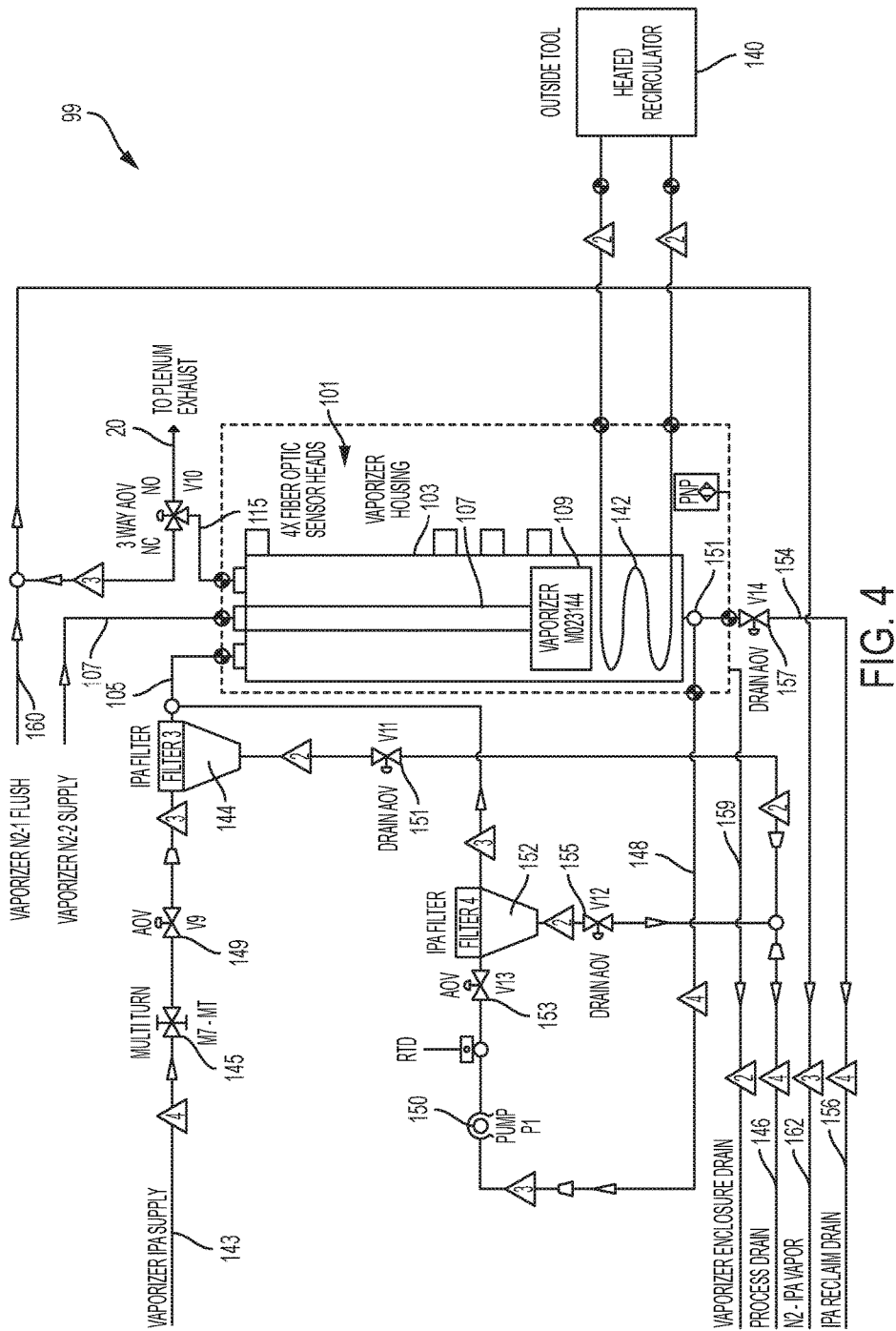
FIG. 4 is a schematic diagram of an exemplary circuit for heating and recirculating IPA in the dryer of FIGS. 1 and 2.
Figure 5:
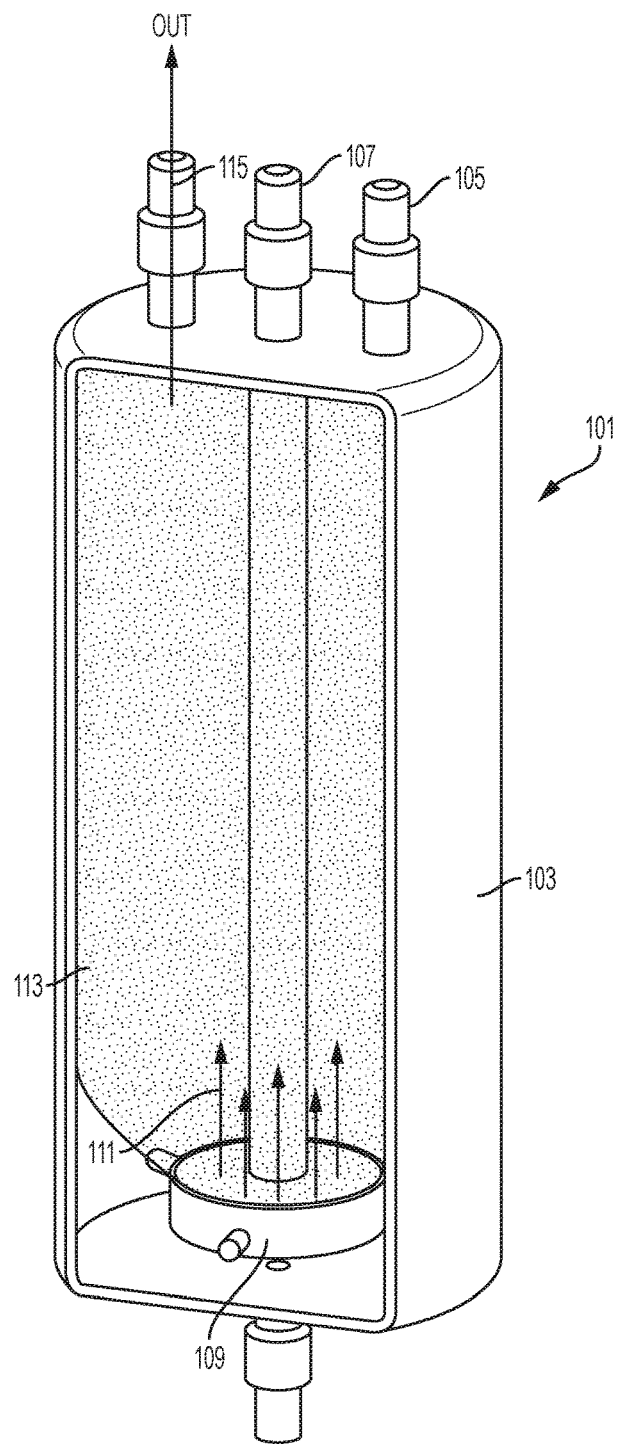
FIG. 5 is a partially broken away perspective view of an exemplary bubbler that can be used in creating IPA vapor in the circuit of FIG. 4.

With reference to FIGS. 4 and 5, an exemplary IPA vapor provision and recirculation system 99 is shown.

One approach for obtaining a mixture or blend of N2/IPA is to bubble N2 through IPA in, for example, a bubbler 101 (FIG. 5) that is contained in a vessel 103, such as in a quartz vessel. The N2 flow is typically connected to and bubbled through a porous material, such as PTFE or ceramic. FIG. 5 illustrates an exemplary bubbler 101 for use in creating IPA vapor. The bubbler 101 comprises the housing or vessel 103 into which liquid IPA is introduced through an IPA inlet 105 to fill the vessel. N2 flows downwardly in this example into the vessel from an inlet 107 and is dispensed through a manifold 109 at the base of the vessel to flow upwardly through the vessel, as indicated by arrows 111. The N2 passes through a porous membrane 113 that is immersed in the liquid IPA. As the N2 passes through the IPA, bubbles are created and carry IPA vapor up and out of the vessel 103 via an outlet 115.

FIG. 4 illustrates the bubbler 101 of FIG. 5 in an exemplary IPA recirculation system 99 of FIG. 4. A heater 140 can circulate heated fluid through a heat exchanger 142 in the base of the vessel 103 to heat the IPA as desired.

Liquid IPA from an IPA supply source is coupled to a conduit 143 and delivered through valves 145, 149 and an IPA filter 144 to the inlet 105 to the bubbler 101. The filter 104 is also coupled through a valve 151 to a process drain line 146 when desired to drain the system. IPA from the vessel 103 can pass through an outlet 151 to a line or conduit 148. This IPA is pumped by pump 150 through this line. From pump 150 the IPA passes through a valve 153 and a filter 152 and back to the line 105 to the inlet to the bubbler. The filter 152 is also coupled to the process drain 146 through a valve 155 for draining this portion of the system as desired. In these diagrams the acronym AOV indicates that the valve is automatically controlled (e.g., by a controller) to open and close. In addition, drain 151 is coupled through a valve 157 to a line 154 to an IPA reclaim outlet 156. The IPA reaching outlet 156 can then be filtered and reused. This exemplary IPA system for the dryer 10 provides an effective way of producing IPA vapor for use in Marangoni drying while reducing the required volume of IPA needed to accomplish the drying process. In FIG. 4, the N2 gas inlet 107 is coupled to an N2 supply source. An N2 flush inlet 160 is also provided to allow the passage of N2 through the system for purging or flushing purposes. N2/IPA vapor from system 99 is delivered to an outlet 162 for passage to the gas dispenser 80 at the upper end of chamber 14 (FIG. 2). The vessel also has a selectively openable drain line 159 that can be used to drain the vessel 103.

Figure 6:
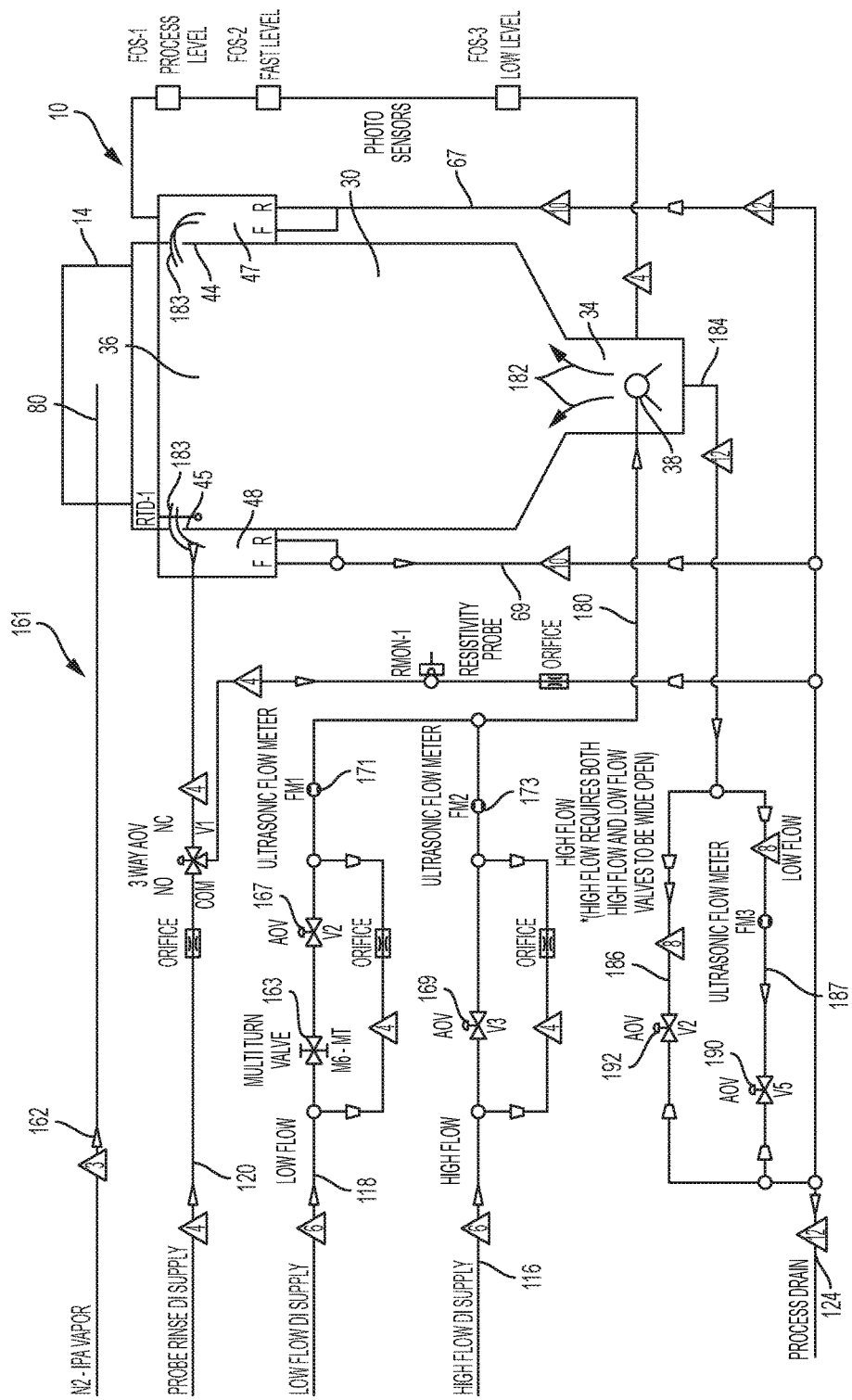
FIG. 6 is a schematic diagram of an exemplary fluid system usable in the dryer of FIGS. 1 and 2.

FIG. 6 discloses an exemplary dryer tank plumbing system 161. As can be seen in FIG. 6, the N2/IPA vapor from the bubbler is delivered via the line 162 to the N2/IPA manifold or dispenser 80 in chamber 14 (see, also, FIG. 2) and thereby to the tank 30 of the dryer 10. Elements of the dryer that have previously been described in connection with FIG. 2 have been assigned the same numbers in FIG. 6 and therefore will not be discussed further. The low flow DI supply line 118 is coupled through the valves 163, 167 and a flow meter 171 to a line 180. In addition, the high flow DI supply line 116 is coupled through a valve 169 and flow meter 173 to the line 180. Line 180 leads to the DI inlet 38 at the lower portion 34 of the tank 30. DI water entering inlet 38 flows upwardly, as indicated by arrows 182, past wafers in the tank (when wafers are present on a first wafer carrier therein) to the respective weirs 44, 45. The water spills over the weirs (flowing water being indicated schematically at 183) and into respective drain channels 47, 48 and into respective drain conduits 67, 69 and then to the process drain line 124.

During the high flow operation, typically the valves 167, 169 in both the low flow and high flow supply lines are open to increase the flow. In contrast, during the low flow only DI supply process, the valve 169 in the high flow DI supply is typically closed and only the low flow DI supply line is open. A tank drain 184 is shown in FIG. 6 and coupled through respective branches 186, 188 and through respective valves 190, 192 and to the process drain line 124. To drain the tank, the valves 190, 192 are selectively opened. The valves 190, 192 are operated to control the draining of liquid from the bath to, for example, achieve Marangoni drying of the first wafer carrier and lifting structure in the dryer.

Figure 7:
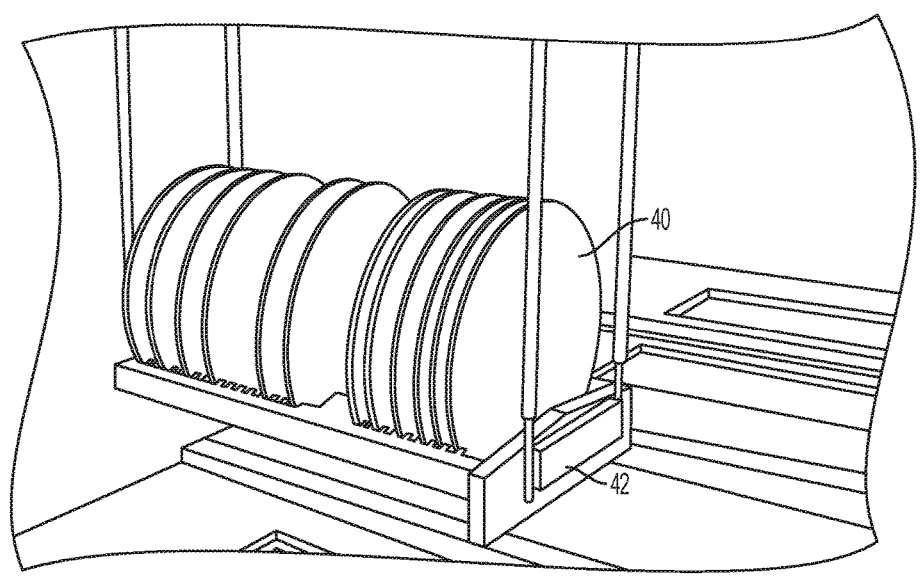
FIG. 7 illustrates semiconductor wafers being carried on an exemplary carrier having a plurality of slots that receive individual wafers.

FIG. 7 illustrates an exemplary first wafer carrier 42 with a plurality of wafers 40 positioned in respective slots of the carrier. Various alternative carrier types can be used. These carriers are moved from process location to process location and in this case are shown suspended by rods as they are moved. The first wafer carrier can be positioned over the tank access opening 32 (FIG. 2) to the tank and lowered onto the lifter 50 within the tank 30.

Figure 8:
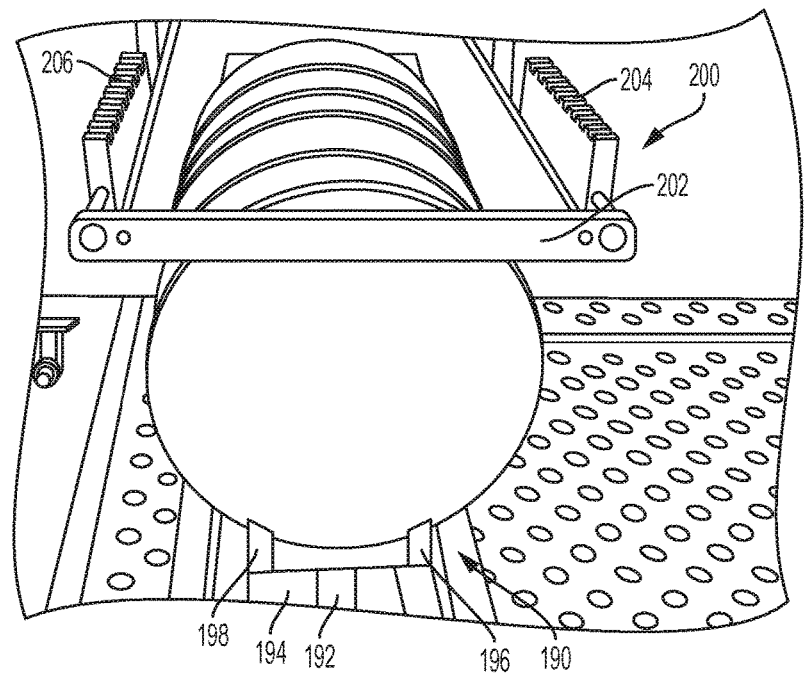
FIG. 8 is a perspective view of an exemplary lifting apparatus for use in lifting wafers from a submerged carrier upwardly into a transportation zone where the wafers can be transferred to a second carrier.
Figure 9:
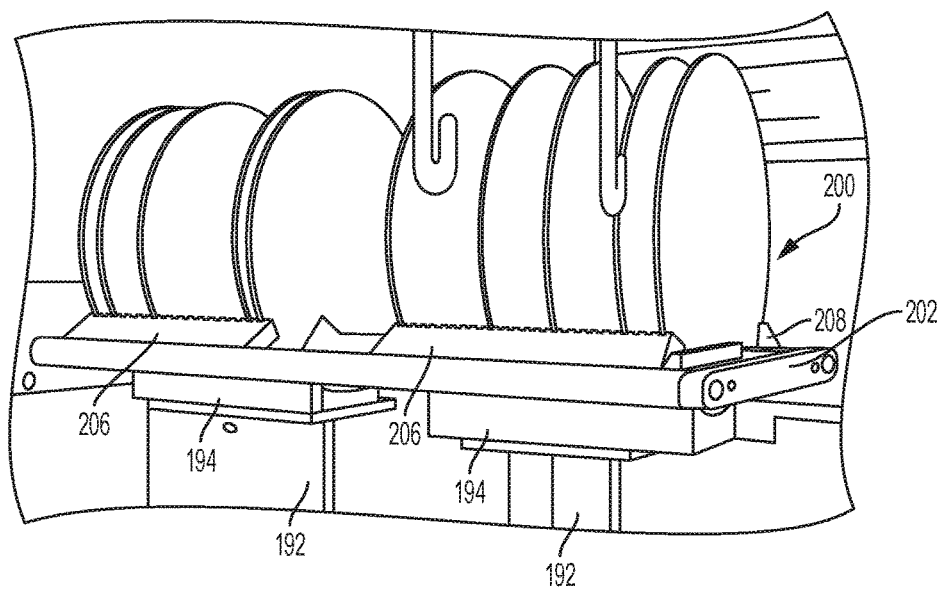
FIG. 9 is an example of a second carrier having combs that receive the wafers in the transportation zone.

FIG. 8 illustrates an exemplary form of wafer lifter indicated generally at 190. The lifter includes a support 192 that carries a tray 194 with respective slotted wafer holders 196, 198 at opposite sides of the tray. As the support 192 is raised away from a first wafer carrier, the wafers are lifted by the wafer holders 196, 198 of the tray 194 upwardly and away from the first wafer carrier and into the lid 14. Alternatively, the lifter of the form shown in FIG. 2 can be used with lifting projection 74 that is raised upwardly relative to the first wafer carrier to lift wafers from the first wafer carrier. An exemplary second or upper carrier 200 is also shown in FIG. 8. Alternatively, the second carrier can take the form shown in FIG. 2. The exemplary second carrier 200 can comprise a frame 202 with respective combs 204, 206 at opposite sides of the frame. As can be seen in FIG. 9, the frame 202 has respective pairs of the combs 206 at one side of the frame and a similar pair of combs 208 at the opposite side of the frame. After the wafers have been lifted through the frame 202, the combs 206 are lowered to retain the wafers in place. The carrier 200 thus is an exemplary carrier that can be positioned in the lid or chamber 14 of the dryer to hold wafers when positioned in the lid. When the wafers are lifted into the chamber 14, they are transferred to the combs which allows the wafers and second carrier to be transported within the chamber to the offset and/or reset positions as well as returned to a tank overlaying position.

Exemplary drying methods are described below in connection with FIGS. 10-21. Dryer components in these figures have been assigned the same numbers as in FIG. 2 and will not be described further.

Figure 10:
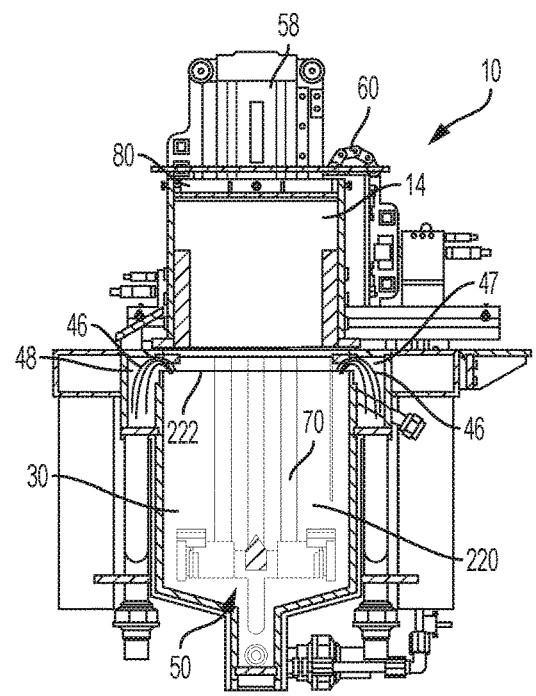
FIG. 10 illustrates an embodiment of a dryer in accordance with this disclosure with a lid or chamber overlaying a filled tank with liquid flowing upwardly through the tank and cascading from the upper end of the tank to a drain.

FIG. 10 is a partially broken away view of an embodiment of an exemplary dryer 10 showing the dryer in the state wherein a wafer receiving tank 30 is filled with deionized water or other liquid in a bath 220 and continuously cascades upwardly and over the upper edges of the tank into drain plenums 47, 48. The cascading water is indicated at 46. The upper level of the bath is indicated at 222 in FIG. 10. Typically, this liquid is flowing at a low flow rate in this idle state.

Figure 11:
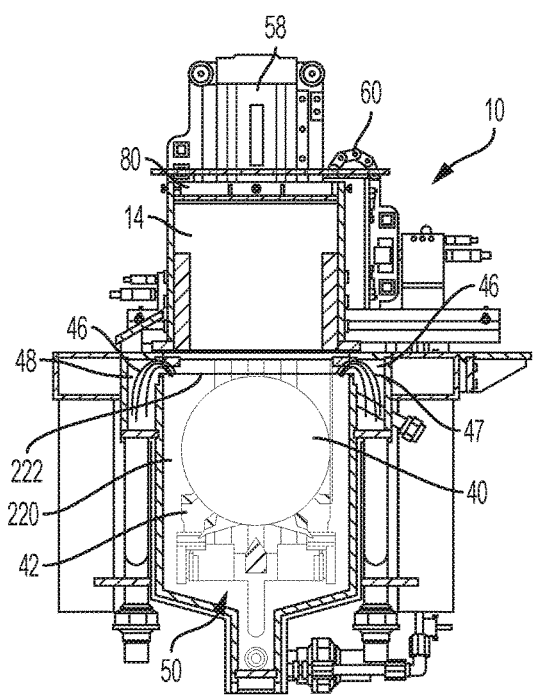
FIG. 11 illustrates a first wafer carrier with one or more wafers thereon supported by the carrier and lifting structure submerged within a bath of liquid in the tank.

FIG. 11 illustrates the dryer of FIG. 10 with wafers 40 positioned on a first wafer carrier 42 and submerged within the bath 220 inside tank 30 and with the wafers being washed by the flow of liquid as described in connection with FIG. 10; except during washing the flow rate of liquid is typically at a higher flow rate than in the idle state. To reach the washing state of FIG. 11, the chamber 14 was moved to a position (e.g., an offset position) to allow the first wafer carrier 42 and one or more carried wafers 40 to be positioned over the tank access opening 32 (FIG. 2) and lowered into the tank 30. The bath 200 is at the level 222 in this state covers the wafers 40.

Figure 12:
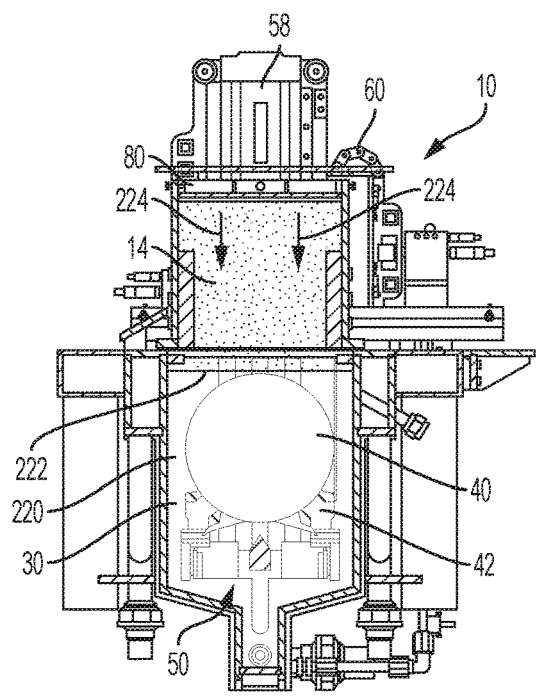
FIG. 12 illustrates the wafers submerged in the bath of liquid with a Marangoni fluid, in this example N2/IPA, being directed downwardly toward the upper surface of the bath.

FIG. 12 illustrates the dryer of FIG. 10 in a subsequent processing state wherein the flow of liquid has been halted and a Marangoni drying fluid, in this example N2/IPA in vapor form, begins flowing from dispenser 80 downwardly from a chamber 14 toward the wafers 40 to form a film of IPA on the surface of the liquid bath 220 in the tank 30.

Arrows 224 schematically indicate this gas flow. The wafers remain submerged in this state in this example.

Figure 13:
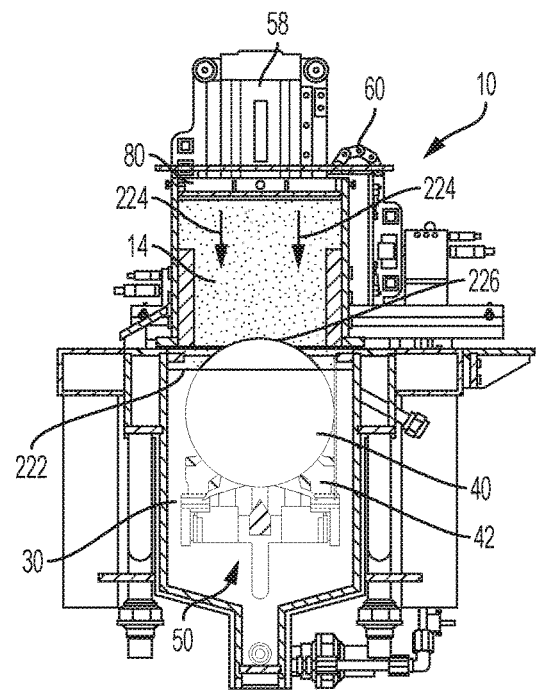
FIG. 13 illustrates the wafers being lifted out of the bath with the first wafer carrier remaining in the bath.

FIG. 13 illustrates the dryer of FIG. 10 in a state wherein the lifter 50 is lifting both the wafers 40 and first wafer carrier 42 supporting the wafers toward the surface 222 of the bath 220. The wafers emerge from the surface of the bath at a rate that accomplishes Marangoni drying. In FIG. 13, a portion 226 of the upper ends of the wafers 40 have emerged from the surface of the bath. It should be noted that the lifter 50 can also lift the wafers upwardly without lifting the carrier, but this is less desirable as by lifting the carrier it is positioned closer to a source of wafer carrier drying gas used to accelerate drying of the first wafer carrier in this exemplary dryer. It is also to be understood that, alternatively, the bath can be drained as the wafers emerge via the lifter, to dry the wafers using the Marangoni effect.

Figure 14:
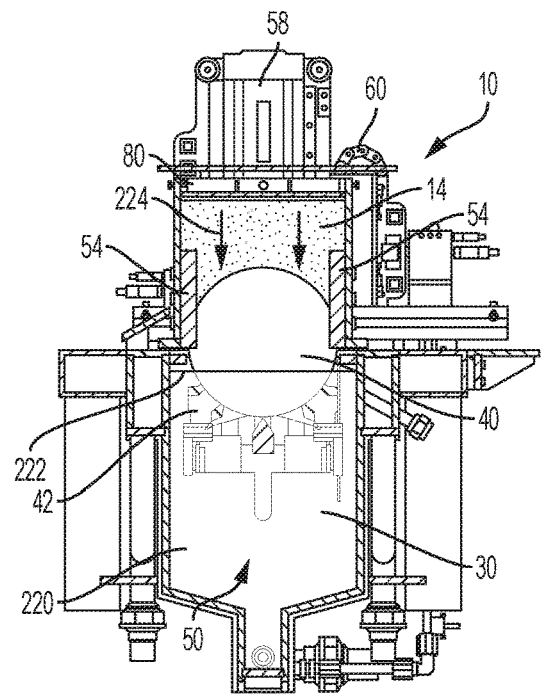
FIG. 14 illustrates the wafers moving upwardly to a position in the chamber and above the bath.

FIG. 14 illustrates the wafers 40 and first wafer carrier 42 lifted upwardly to a further extent than shown in FIG. 13. In FIG. 14, the lifter 50 has raised the first wafer carrier to a location where it is still submerged below the surface 222 of the bath 220 and at which the wafer carrier is positioned at its upper most position in this example.

Figure 15:
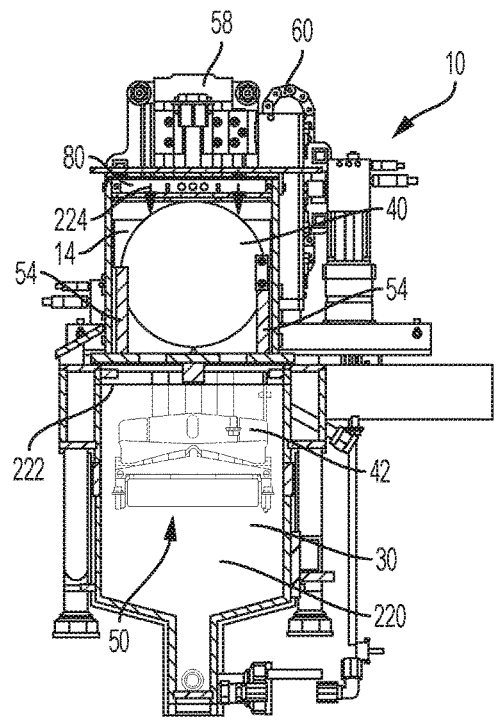
FIG. 15 illustrates the wafers positioned on a second carrier above the bath and with the first wafer carrier remaining submerged.

FIG. 15 illustrates the operation of the lifter to lift the wafers 40 upwardly relative to the first wafer carrier 42 to a transfer zone in the lid and to a second wafer carrier comprising combs 54 in this example.

Figure 16:
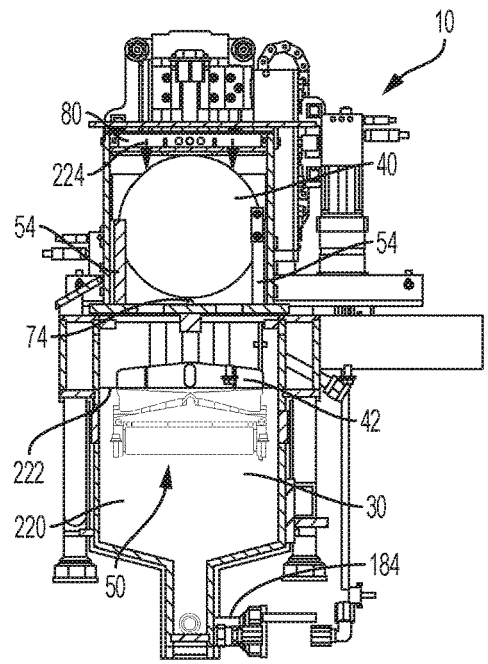
FIG. 16 illustrates draining of the bath, with N2/IPA continuing to flow as the bath is drained and wherein the bath is desirably drained to enhance the Marangoni drying effect on the first wafer carrier and lifting structure.

FIG. 16 illustrates the wafers 40 in their position on holders 54 comprising a second wafer carrier. The IPA/N2 vapor 224 can continue flowing in this example. In addition the liquid bath 220 is being drained via drain 184 to expose the first wafer carrier 42 (in FIG. 16 first wafer carrier 42 is shown only partially submerged). Draining can be accomplished at a fast rate or at a rate that results in Marangoni drying of the first wafer carrier and lifting structure.

Figure 17:
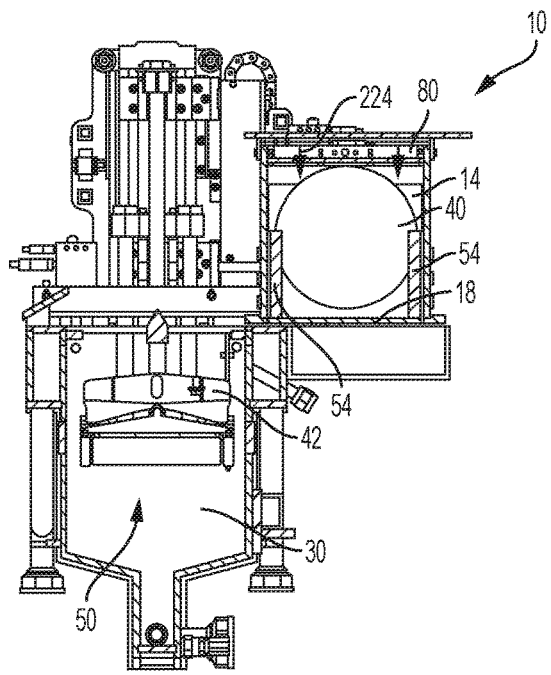
FIG. 17 illustrates the wafers and second wafer carrier shifted to an offset position.

FIG. 17 illustrates the lid or chamber 14 shifted to an offset position 18 where the chamber 14 and wafers 40 no longer overlay the tank opening and bath. In FIG. 17 the bath has been drained. N2, indicated by arrows 224, is desirably being directed downwardly across wafers 40 to continue to sweep the wafers in the offset position.

Figure 18:
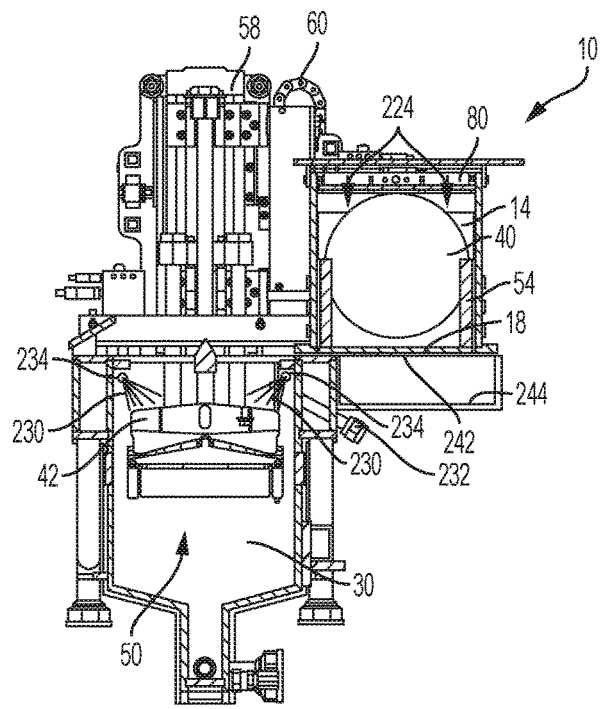
FIG. 18 illustrates the use of gas, such as heated N2, to accelerate the drying of the first wafer carrier and lifting structure.

FIG. 18 illustrates N2 gas 230 (which can be heated) being directed toward the first wafer carrier 42 and wafer lifting structure 50 to complete drying of these elements in an accelerated manner. The N2 gas is provided via gas inlet 232 to respective air knives 234 positioned along opposed sides of the upper end of the tank 30.

Figure 19:
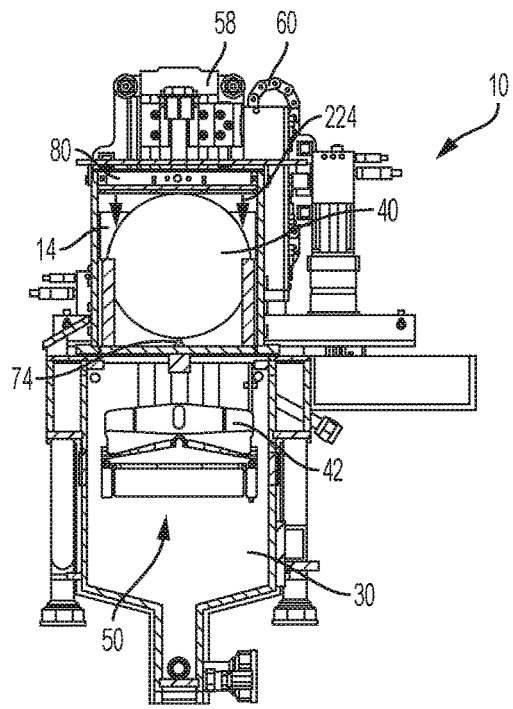
FIG. 19 illustrates the wafers repositioned on the second carrier at a location above the tank.

FIG. 19 illustrates the return of chamber 14 and the wafers 40 to a position overlaying the now empty tank 30 and dried first wafer carrier 42.

Figure 20:
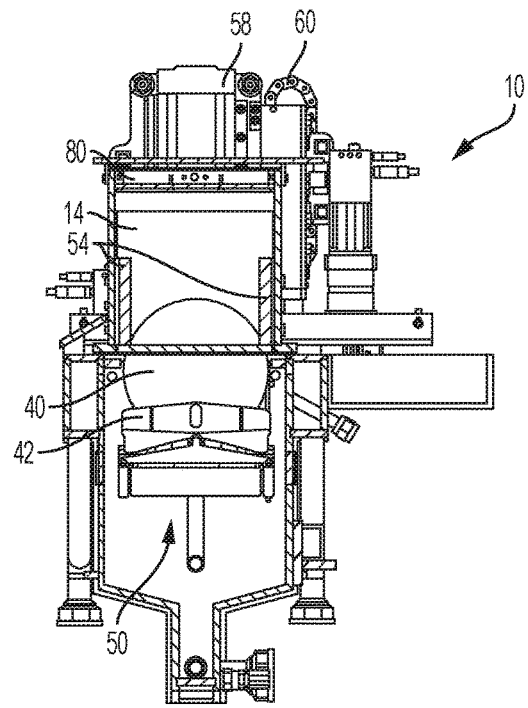
FIG. 20 illustrates the wafers lowered onto the first wafer carrier in the drained tank.

FIG. 20 illustrates the wafers 40 being repositioned (lowered) by the lifter onto the first wafer carrier.

Figure 21:
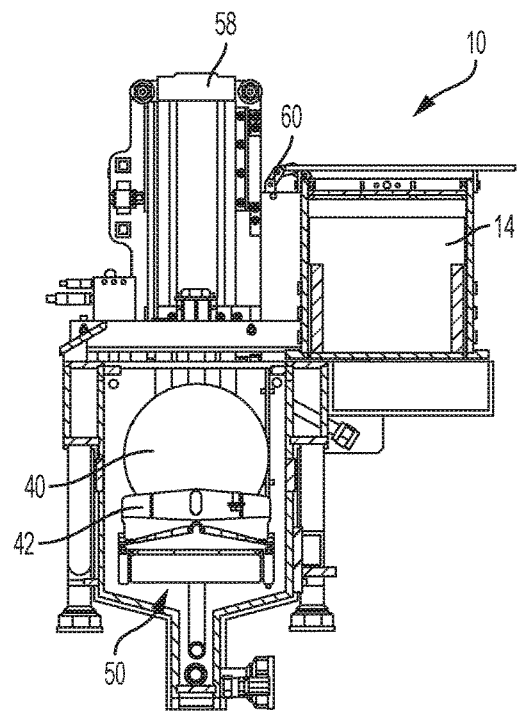
FIG. 21 illustrates the wafers on the first wafer carrier with the wafer receiving chamber moved to an offset position so as to open the dryer for removal of the wafers and first wafer carrier upwardly through an upwardly facing dryer opening.

FIG. 21 illustrates the chamber 14 slid to its offset position 18 allowing lifting of the dried first wafer carrier 42 and dried wafers 40 to a position above the tank 30 so that the carrier and wafers can be moved to its next process destination. The bath can then be refilled with the process returning to the FIG. 10 condition awaiting the next wafer carrier and wafers. The lid is shifted to the offset position 18 to allow depositing of the wafers into the bath for cleaning and repeating the process.

Table 1 below provides exemplary operating parameters for a rapid drying cycle.

TABLE 1

Exemplary IPA Dryer Condition for a < 10 Min. Dry Cycle.

| PARAMETERS | SETTING |
| --- | --- |
| Fill Timeout (sec) | 600 |
| Drain Timeout (sec) | 300 |
| Blind Drain Timeout (sec) | 5 |
| Raise Timeout (sec) | 240 |
| Lock Timeout (sec) | 10 |
| Slow Drain Timeout (sec) | 300 |
| Open Lid Time (sec) | 20 |
| Close Lid Time (sec) | 20 |
| Raise/Lower Speed (mm/sec) | 10 |
| Process Speed-1 (mm/sec) | 1.5 |
| Process Speed-2 (mm/sec) | 0.5 |
| Auto Cycle Time (min) | 0 |

Any of the disclosed methods can be under the control of a controller or other computer coupled to the various valves and drive motors in the system to provide control signals and to receive sensor signals from system components. The controller or computer that controls the system is programmed with computer-executable instructions stored on one or more computer-readable media (e.g., computer-readable media, such as one or more optical media discs, volatile memory components (such as DRAM or SRAM), or non-volatile memory components (such as hard drives)). The computer-executable instructions can be executed, for example, on a single local computer (e.g., with a general-purpose processor (e.g., a reduced instruction set computing (RISC) or complex instruction set computing (CISC) processor), or in a network environment (e.g., via the Internet, a wide-area network, a local-area network, a client-server network (such as a cloud computing network), or other such network) using one or more network computers.

It should also be well understood that control of the dryer can be performed, at least in part, by one or more hardware logic components, instead of software. For example, and without limitation, illustrative types of hardware logic components that can be used include Field-programmable Gate Arrays (FPGAs), Application-specific Integrated Circuits (ASICs), Application-specific Standard Products (ASSPs), System-on-a-chip systems (SOCs), and Complex Programmable Logic Devices (CPLDs).

The foregoing and other objects, features, and advantages of the invention will become more apparent from the following detailed description, which proceeds with reference to the accompanying figures.

In view of the many possible embodiments to which the principles of the disclosed invention may be applied, it should be recognized that the illustrated embodiments are only preferred examples of the invention and should not be taken as limiting the scope of the invention.

I claim:

1. A method of drying semiconductor wafers comprising:
removing one or more semiconductor wafers in a bath of liquid from a first wafer carrier in the bath and from the bath, the one or more wafers comprising wafer surfaces and the first wafer carrier comprising first wafer carrier surfaces;
positioning the removed one or more wafer carriers on a second wafer carrier that is in a first position that is out of the bath;
flowing a mixture of nitrogen (N2) and isopropyl alcohol (IPA) onto the one or more wafers as the one or more wafers are removed from the bath and positioned on the second wafer carrier such that the wafer surfaces of the one or more wafers are dried at least in part by a surface tension gradient between the IPA and the liquid in the bath;

moving the second wafer carrier with the one or more wafers thereon from the first position to a second position;

draining the liquid from the bath to expose the first wafer carrier;

flowing a mixture of N2 and IPA onto the first wafer carrier as the first wafer carrier emerges from the bath and as the bath is drained such that the first wafer carrier is dried at least in part by a surface tension between the IPA and first wafer carrier surfaces;

directing heated N2 onto the first wafer carrier to accelerate drying of the first wafer carrier;

providing a barrier between the first wafer carrier and the one or more wafers on the second wafer carrier in the second position to impede mist and droplets generated during drying of the first wafer carrier from reaching the one or more wafers on the second wafer carrier in the second position; and returning the one or more wafers to the first wafer carrier following drying of the first wafer carrier.

2. A method according to claim 1 wherein providing a barrier comprises enclosing the second wafer carrier in a chamber at least when the second wafer carrier is in the second position to thereby screen the one or more wafers on the second wafer carrier from mist and droplets generated during drying of the first wafer carrier.

3. A method according to claim 1 wherein providing a barrier comprises flowing N2 gas over the at least one or more wafers on the second wafer carrier in the second position in a direction that sweeps mist and droplets generated during drying of the first wafer carrier away from the one or more wafers on the second wafer carrier.

4. A method according to claim 1 wherein providing a barrier comprises positioning a shield between the at least one or more wafers on the second wafer carrier in the second position and the first wafer carrier.

5. A method according to claim 1 wherein providing a barrier comprises flowing N2 gas over the at least one or more wafers on the second wafer carrier in the second position in a direction that sweeps mist and droplets generated during drying of the first wafer carrier away from the one or more wafers and providing a barrier also comprises positioning a shield between the at least one or more wafers on the second wafer carrier in the second position and the first wafer carrier.

6. A method according to claim 5 wherein the shield comprises a wall of a chamber within which the one or more wafers and the second wafer carrier are positioned.

7. A method according to claim 1 comprising discharging static electricity from the second wafer carrier in the second position.

8. A method according to claim 1 wherein N2 is directed toward the one or more wafers on the second wafer carrier during at least a portion of a time of directing heated N2 onto the first wafer carrier.

9. A method according to claim 8 wherein the N2 is directed toward the one or more wafers on the second wafer carrier as the second wafer carrier is moved from the first position to the second position and during at least a portion of the time that heated N2 is directed onto the first wafer carrier.

10. A method according to claim 1 wherein the one or more wafers are removed from the bath by lifting the one or more wafers upwardly and away from the first wafer carrier; and wherein positioning the one or more wafer carriers on the second wafer carrier comprises positioning the one or more wafers on the second wafer carrier in a first position that is above the bath; and wherein moving the second wafer carrier to the second position comprises moving the second wafer carrier to a second position that is spaced from and not above the liquid bath.

11. A method according to claim 10 wherein returning the one or more wafers to the first wafer carrier comprises moving the second wafer carrier with the one or more wafers thereon from the second position to the first position and lowering the one or more wafers from the first position onto the first wafer carrier.

12. A method according to claim 10 wherein positioning the one or more wafers on the second wafer carrier comprises positioning the one or more wafers on a second wafer carrier positioned in a chamber above the bath; and wherein moving the second wafer carrier with the one or more wafers thereon from the first position to a second position comprises moving the chamber to move the second wafer carrier with the one or more wafers thereon from the first position to the second position.

13. A method of drying semiconductor wafers comprising:

moving one or more semiconductor wafers from a first wafer carrier in a of liquid and out of the bath of liquid and to a second wafer carrier that is out of the bath of liquid and spaced from the first wafer carrier;

flowing a mixture of nitrogen (N2) and isopropyl alcohol (IPA) onto the one or more wafers as the one or more wafers are moved out of the bath of liquid such that the surfaces of the one or more wafers are dried at least in part by a surface tension gradient between the IPA and the liquid in the bath;

drying the first wafer carrier;

shielding the one or more wafers on the second wafer carrier from mist or droplets arising from drying the first wafer carrier; and returning the one or more wafers from the second wafer carrier to the first wafer carrier following drying of the first wafer carrier.

14. A method according to claim 13 wherein moving the one or more wafers out of the bath comprises lifting the one or more wafers from the first wafer carrier and positioning the lifted one or more wafers onto the second wafer carrier located above the bath and wherein the method also comprises moving the second wafer carrier with the one or more wafers thereon to a position at which the one or more wafers on the second wafer carrier are moved further from the bath.

15. A method according to claim 14 wherein the second wafer carrier with the one or more wafers thereon is moved to a position in which the second wafer carrier and one or more wafers on the second wafer carrier do not overlay the bath.

16. A method according to claim 14 wherein drying the first wafer carrier comprises directing heated N2 toward the first wafer carrier and wherein shielding the one or more wafers on the second wafer carrier comprises directing N2 toward the one or more wafers on the second wafer carrier in a direction that sweeps mist and droplets generated during drying of the first wafer carrier away from the one or more wafers on the second wafer carrier during at least a portion of a time that heated N2 is directed onto the first wafer carrier.

17. A method according to claim 14 comprising directing the N2 toward the one or more wafers on the second wafer carrier during at least a portion of a time that the second wafer carrier with the one or more wafers are moved to the position further from the bath.

18. A method according to claim 13 wherein shielding the one or more wafers on the second wafer carrier comprises enclosing the one or more wafers to thereby screen the one or more wafers from mist and droplets generated during drying of the first wafer carrier.

19. A method according to claim 13 comprising discharging static electricity from the second wafer carrier with the one or more wafers thereon.

20. A method according to claim 13 wherein drying the first wafer carrier comprises draining the liquid from the bath to expose the first wafer carrier; and flowing a mixture of N2 and IPA onto the first wafer carrier as the first wafer carrier emerges from the bath and as the bath is drained such that the first wafer carrier is dried at least in part by the surface tension between the IPA and surfaces of the first wafer carrier.

21. An apparatus for drying semiconductor wafers comprising:

a wafer receiving tank comprising a tank body which defines an interior tank chamber comprising upper and lower tank chamber portions, a top portion with a wafer carrier receiving opening communicating with the tank chamber and sized for receiving a first wafer carrier with one or more semiconductor wafers thereon, and a bottom portion, the tank further comprising a liquid inlet communicating with the lower tank chamber portion and for coupling to a source of cleaning liquid, the tank chamber having at least one overflow outlet at the upper tank chamber portion such that liquid from the liquid inlet flows upwardly to the at least one overflow outlet, the tank having a drain outlet communicating with the lower tank chamber portion;

a wafer carrier lifter positioned in the tank chamber and positioned to receive a first wafer carrier with one or more semiconductor wafers thereon through the wafer carrier receiving opening, a first actuator coupled to the wafer carrier lifter and operable to lift and lower the wafer carrier lifter and the first wafer carrier received by the wafer carrier lifter and also to lift the one or more semiconductor wafers from a position on the first wafer carrier from a first lower wafer carrier position on the first wafer carrier to a second elevated wafer carrier transfer position above the first wafer carrier, wherein when in the first lower wafer carrier position the first wafer carrier and the one or more semiconductor wafers thereon are submerged in liquid in the interior tank chamber, the first actuator also being operable to lift the one or more semiconductor wafers thereon from the liquid in the lower chamber at a controlled wafer lifting rate;

a wafer drying chamber coupled to the tank and mounted for movement from a first drying chamber position overlaying and covering the wafer carrier receiving opening to a second drying chamber position that is offset from the wafer carrier receiving opening and from the second drying chamber position to the first drying chamber position, a second actuator coupled to the wafer drying chamber and operable to move the wafer drying chamber from the first drying chamber position to the second drying chamber position and from the second drying chamber position to the first drying chamber position, a second wafer carrier positioned in the wafer drying chamber, the second wafer carrier receiving the one or more wafers from the first wafer carrier that have been lifted to the second elevated wafer carrier transfer position, the wafer drying chamber comprising a first gas inlet for coupling to a source of blended isopropyl alcohol and nitrogen (IPA/N2) so as to provide IPA/N2 to the surfaces of the wafers as the wafers are lifted out of the liquid in the interior tank chamber by the wafer carrier lifter toward the second elevated wafer carrier transfer position, the IPA in the IPA/N2 blend at least partially drying the surfaces of the wafers by surface tension gradient drying as the wafers are lifted out of the liquid;

a valve coupled to the tank chamber and operable to drain the liquid from the tank through the drain at a rate that the IPA/N2 at least partially dries the surfaces of the first wafer carrier and wafer carrier lifter as the tank is drained to expose the first wafer carrier and wafer carrier lifter;

the second actuator being operable to move the wafer drying chamber and the second wafer carrier with the received one or more wafers from the first drying chamber position to the second drying chamber position and from the second drying chamber position to the first drying chamber position; and at least one gas applicator positioned in the tank chamber for coupling to a source of N2 to deliver N2 to the first wafer carrier to continue drying the first wafer carrier and wafer lifter following exposure of the first wafer carrier and wafer lifter from liquid in the lower tank chamber portion and with the wafer drying chamber and one or more wafers from the first wafer carrier on the second wafer carrier in the second drying chamber position.

22. An apparatus according to claim 21 comprising a recess defining structure having a recess positioned beneath the one or more wafers on the second wafer carrier in the wafer drying chamber with the wafer drying chamber in the second drying chamber position; a static discharger positioned to discharge static electricity from the recess defining structure; a wafer dryer support, the wafer drying chamber being slidably coupled to the wafer dryer support for sliding movement of the wafer drying chamber from the first to the second drying chamber positions and the second to the first drying chamber positions by the second actuator; and wherein the wafer dryer chamber has a gas outlet for coupling to a source of N2 to direct a flow of N2 gas across the one or more wafers on the second carrier at least for the portion of the time that the wafer drying chamber is in the second drying chamber position.

23. A method of drying semiconductor wafers comprising:

moving one or more semiconductor wafers from a first wafer carrier in a bath of liquid in a tank and out of the bath of liquid and to a second wafer carrier that is out of the bath of liquid and spaced from the first wafer carrier;

flowing a mixture of nitrogen (N2) and isopropyl alcohol (IPA) onto the one or more wafers as the one or more wafers are moved out of the bath of liquid such that the surfaces of the one or more wafers are dried at least in part by a surface tension gradient between the IPA and the liquid in the bath;

draining liquid from the tank to expose the first wafer carrier in the tank;

drying the first wafer carrier;

shielding the one or more wafers on the second wafer carrier from mist or droplets arising from drying the first wafer carrier in the tank; and returning the one or more wafers from the second wafer carrier to the first wafer carrier following drying of the first wafer carrier.

\* \* \* \* \*

UNITED STATES PATENT AND TRADEMARK OFFICE
CERTIFICATE OF CORRECTION

PATENT NO. : 10,473,396 B2
APPLICATION NO. : 15/782233
DATED : November 12, 2019
INVENTOR(S) : Tice Page 1 of 1

It is certified that error appears in the above-identified patent and that said Letters Patent is hereby corrected as shown below:

In the Claims

Column 18, Line 26, "wafer carrier in a of liquid and out of the bath of liquid" should read --wafer carrier in a bath of liquid and out of the bath of liquid--

Signed and Sealed this
Twenty-eighth Day of April, 2020

Andrei Iancu
*Director of the United States Patent and Trademark Office*